US009537112B2

(12) United States Patent
Li et al.

(10) Patent No.: US 9,537,112 B2
(45) Date of Patent: Jan. 3, 2017

(54) SOLID-STATE COMPOSITIONS AND METHODS FOR GENERATING WHITE LIGHT

(75) Inventors: Jing Li, Cranbury, NJ (US); Mojgan Roushan, Goleta, CA (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 0 days.

(21) Appl. No.: 14/239,616

(22) PCT Filed: Aug. 19, 2012

(86) PCT No.: PCT/US2012/051516
§ 371 (c)(1),
(2), (4) Date: Feb. 19, 2014

(87) PCT Pub. No.: WO2013/028585
PCT Pub. Date: Feb. 28, 2013

(65) Prior Publication Data
US 2014/0197400 A1   Jul. 17, 2014

Related U.S. Application Data

(60) Provisional application No. 61/525,423, filed on Aug. 19, 2011.

(51) Int. Cl.
*C09K 11/08*     (2006.01)
*C09K 11/56*     (2006.01)
(Continued)

(52) U.S. Cl.
CPC ......... *H01L 51/5036* (2013.01); *C09K 11/883* (2013.01); *H01L 33/502* (2013.01); *Y02B 20/181* (2013.01)

(58) Field of Classification Search
CPC . C09K 11/0811; C09K 11/565; C09K 11/674; C09K 11/883
(Continued)

(56) References Cited

U.S. PATENT DOCUMENTS

2010/0224861 A1   9/2010   Jain et al.
2011/0049560 A1*  3/2011   Li ................................. 257/103

FOREIGN PATENT DOCUMENTS

WO   WO2009120716   * 10/2009

OTHER PUBLICATIONS

Ki. Direct white light emission from inorganic-organic hybrid semiconductor bulk materials. | J. Mater. Chem., 2010, 20, 10676-10679.*

(Continued)

*Primary Examiner* — Matthew E Hoban
(74) *Attorney, Agent, or Firm* — Fox Rothschild LLP

(57) ABSTRACT

This application discloses a new family of inorganic-organic hybrid semiconductor bulk materials built on periodic nano-structured 2D layers of ZnS that emit bright white light with high quantum efficiency. These ZnS-based crystalline inorganic-organic hybrid semiconductors have well defined and precisely controllable crystal structure and composition. Their optical emission properties, including intensity, quantum yield, and color quality, can be systematically tuned by varying the composition of both inorganic and organic components. Methods for preparing these materials, use of these materials as a new type of single-phased white light emitting phosphors, and their applications in making WLED devices are also disclosed.

20 Claims, 16 Drawing Sheets

(51) Int. Cl.
*C09K 11/57* (2006.01)
*C09K 11/88* (2006.01)
*H01L 51/50* (2006.01)
*H01L 33/50* (2010.01)

(58) Field of Classification Search
USPC .................................................. 252/301.6 S
See application file for complete search history.

(56) References Cited

OTHER PUBLICATIONS

Yao. Synthesis of Semiconducting Functional Materials in Solution: From II-VI Semiconductor to Inorganic-Organic Hybrid Semiconductor Nanomaterials. Adv. Func. Mat. vol. 18, Issue 21 Nov. 10, 2008 pp. 3357-3366.*

Huang. From Single to Multiple Atomic Layers: A Unique Approach to the Systematic Tuning of Structures and Properties of Inorganic-Organic Hybrid Nanostructured Semiconductors. J. Am. Chem. Soc. 2007, 129, 3157-3162.*

Pan. Color-Tunable Photoluminescence of Alloyed $CdS_xSe_{1-x}$ Nanobelts. J. Am. Chem. Soc. 2005, 127, 15692-15693.*

Liu. Wavelength-Controlled Lasing in$Zn_xCd_{1\pm x}S$ Single-CrystalNanoribbons. Wavelength-Controlled Lasing in$Zn_xCd_{1\pm x}S$ Single-CrystalNanoribbons.*

\* cited by examiner

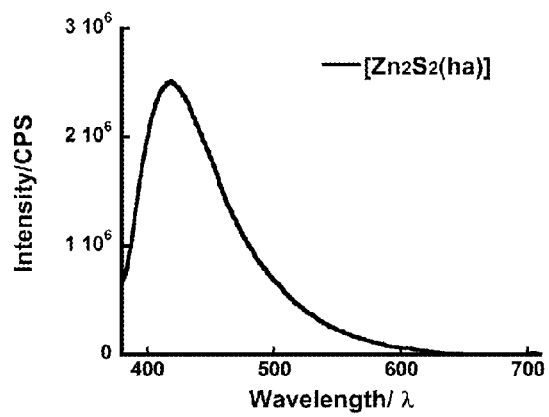
Figure 6
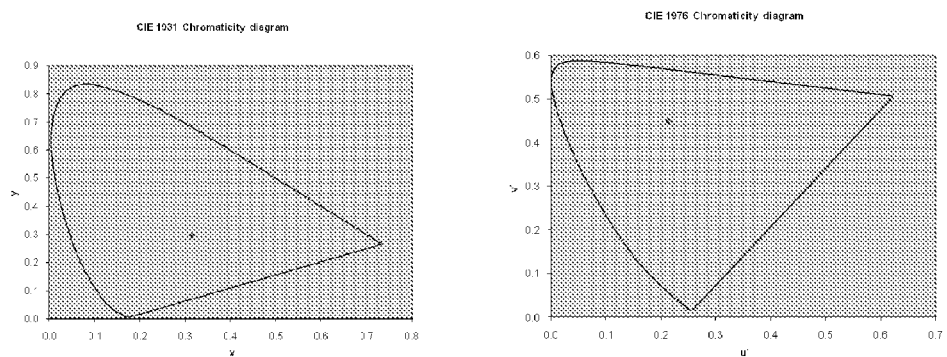
(a)
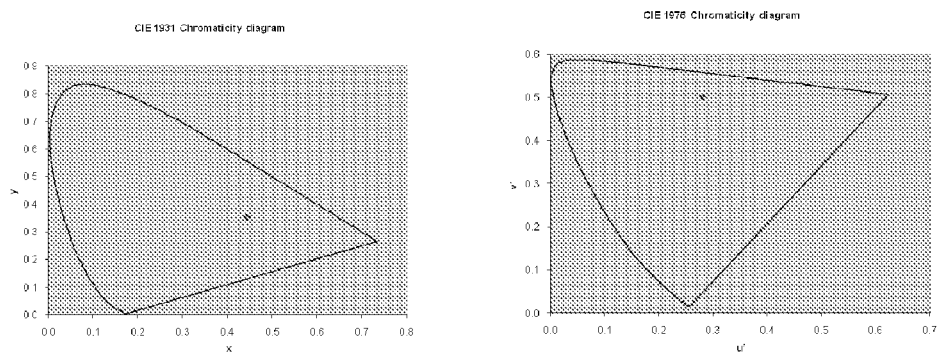
(b)

(c)

(a)

(b)

(a)   (b)   (c)   (d)   (e)

SOLID-STATE COMPOSITIONS AND METHODS FOR GENERATING WHITE LIGHT

CROSS REFERENCE TO RELATED APPLICATIONS

This application claims the benefit under 35 U.S.C. §119(e) of U.S. Provisional Application No. 61/525,423, filed on Aug. 19, 2011, which is incorporated herein by reference in its entirety.

STATEMENT REGARDING FEDERALLY SPONSORED RESEARCH

The invention described herein was supported in whole or in part by grants from the National Science Foundation via Grant No. DMR-0903661 (Nanotechnology for Clean Energy IGERT), and Grant No. DMR-0706069. The U.S. Government has certain rights in this invention.

FIELD OF THE INVENTION

The present invention relates to a new family of inorganic-organic hybrid semiconductor bulk materials as single-phased white light emitters, which can emit bright white light with high quantum efficiency, and their preparation methods and applications.

BACKGROUND OF THE INVENTION

Illumination shares no less than 20% of civilian electric energy consumption, which accounts for 1.9 GT of $CO_2$ emissions. (Taguchi, T., *IEEJ Trans.* 2008, 3, 21.) The ever-increasing energy demands and the concerns of global warming are pressing for the development of high-efficiency light sources to reduce energy consumption. Solid-state lighting (SSL) in the form of light-emitting diodes (LEDs) can convert electricity to light much more effectively than conventional lighting sources. It has been predicted that a nation-wide move toward SSL for general illumination in the U.S. could save 32.5 quads of primary energy between 2012 and 2027. Therefore, high efficiency LEDs are being explored intensely, especially white LEDs (WLEDs), which have been considered to be a potential light source to replace conventional lighting systems such as fluorescent lamps and incandescent bulbs.

There are currently two major WLED systems: multi-chip WLEDs and one-chip WLEDs. (Taguchi, T., *Ieej Trans.* 2008, 3, 21.) In the multi-chip WLEDs, white light is created by combining three LED chips with colors of red (R), green (G), and blue (B), respectively. Since each LED requires a power source, and each source has its own specific lighting characteristic, balancing their luminous intensity to obtain an even color mixture is a challenging task and often results in inadequate illumination. Uchida, Y.; Taguchi, T., *Opt. Eng.* 2005, 44, 124003. In addition, RGB multi-chip LEDs are most expensive. Different from the multi-chip WLEDs, the one-chip WLEDs consist of a LED (blue, near-ultraviolet, or ultraviolet) and phosphors, namely phosphor-converted WLEDs (pc-WLEDs). The first commercialized pc-WLEDs are constructed by combining the blue InGaN chip with the yellow YAG:Ce phosphor (Fasol, G.; Nakamura, S. The Blue Laser Diode:GaN Based Blue Light Emitters and Lasers; Springer: Berlin, 1997.), in which the blue light from the LED excites the YAG:Ce phosphor to emit yellow light, which is subsequently mixed with the blue light to generate white light. However, these WLEDs have the problem of achieving a high color rendering index of over 85 due to their red spectral deficiency. (Mueller, A. H., et al., *Nano Lett.* 2005, 5, 1039.) Compared with the RGB WLEDs and blue-YAG WLEDs, the near-ultraviolet or ultraviolet LED pumped WLEDs fabricated by UV-LED chips coated with white light-emitting single-phased phosphors or RGB tri-color phosphors may overcome the aforementioned shortcomings owing to the invisible emission of the LED chip, and thus, have been considered an important and promising future direction of SSL technology. (Zhang, Q. Y., et al., *Mater. Sci. Eng. R* 2010, 71, 1.) Although NUV-LED+RGB phosphors represent one of the best white light assemblies with both high luminous efficiency and high CRI, RGB phosphors obtained by mixing three phosphors with colors of red, green, and blue, respectively, suffer from complex blending of different phosphors, lack of efficient red phosphors, and self-absorption. (Yang, W. J., et al., *Chem. Mater.* 2005, 17, 3883.) Pc-WLEDs with single-phased white-emitting phosphors can eliminate the need of complex color mixing or conversion techniques, enabling easy fabrication with perfect color reproducibility, stability and high efficiency. Clearly, the development of this kind of pc-WLEDs depends on the breakthrough of the study on single-phased white-emitting phosphors.

Among several kinds of single-phased white-light emitting phosphors developed in recent years for use in WLEDs including organic molecules and inorganic nanomaterils, semiconductor nanocrystals (NCs) are an intensively explored group because of their size-dependent optical and electronic properties, cost-effective solution-based processability, and high quantum yield. (Dai, Q. Q., et al., *Small* 2010, 6, 1577.) A large number of white-light emitting NC systems have been synthesized, including ZnS:Pb, ZnSe, "magic-sized" CdSe, Mn-doped CdS, Mn-doped ZnS, trap-rich CdS, onionlike CdSe/ZnS/CdSe/ZnS, and alloyed $Zn_xCd_{1-x}Se$. In particular, the "magic-sized" CdSe NCs (average diameter less than 2 nm) have become a topic of intensive interest. Unlike traditional NCs (diameters larger than 2 nm) that exhibit near-monochromatic band-edge photoluminescence, the magic-sized CdSe NCs emit a broad white light that covers the entire visible spectrum as a consequence of very high surface-to-volume ratio which leads to a significantly large number of midgap surface sites. Most recently, WLEDs based on the electroluminescence of the magic-sized CdSe NCs that have excellent color characteristics and high color rendering indexes are reported. (Schreuder, M. A., et al., *Nano Lett.* 2010, 10, 573. However, these WLEDs suffer from very low luminous efficiency (~1.0 lm/W). (Dai, Q. Q., et al., *Small* 2010, 6, 1577.) The weak correlations among the quantum dots make it difficult to achieve high conductivity and mobility required for a LED. Semiconductor bulk materials that have good transport properties and can convert electricity directly to white light are most desirable.

As an alternative lighting source, solid state lighting (SSL) technologies (primarily light emitting diodes and organic light emitting diodes) have received considerable attention in recent years due to their enormous potential for use in lighting and displays. The major advantages of SSL are lower energy consumption, higher efficiency, and longer lifetime. White light emitting diodes (WLEDs) are of particular interest because of the great need in general illumination applications. Common approaches to produce WLEDs include blending of three primary colored LEDs, namely red, green, and blue (RGB) diodes, or combination of a blue (or UV) LED with a yellow phosphor (or multiphosphors). Either process requires complex doping/mixing and delicate control of multiple materials and colors, which proves both challenging and costly.

At the present time, commercially available WLEDs are predominantly phosphor based (e.g. a yellow emitting phosphor, yttrium aluminum garnet or (YAG):Ce3+, coupled with a blue emitting InGaN/GaN diode). While less expensive than the RGB diodes, the (YAG):Ce3+ type phosphors and WLEDs have issues such as inaptness for solution process, poor color rendering index (CRI) and high correlated color temperature (CCT), and more impotantly the issues of rare-earth element (REE) supply shortage, which limit their widespread commercialization in general lighting market. Semiconductor quantum dots (QDs) or nanocrystals (NCs) with broad and strong absorption and tunable emission are promising alternative phosphors because they are solution processable. However, their emission bands are often too narrow. White light obtained by combining blue-, green-, and red-emitting QDs of various sizes, on the other hand, often suffers from low efficiency caused by self-absorption, scattering and related energy transfer issues. In addition, it is of great difficulty and complexity to control the size of QDs and maintain an appropriate amount of each component to balance the color. WLEDs based on QDs/NCs typically have relatively low quantum efficiency (QE), e.g., 2% for Mn-doped CdS NCs and 2-3% for magic sized CdSe NCs.

These problems may be reduced or eliminated by developing (a) more complex QDs/NCs composites or (b) single-phased white light emitters in bulk form. For (a), significantly improved quantum efficiency of 30% for onion-like CdSe/ZnS/CdSe/ZnS, 17% for trap-rich CdS, 17% for Cu:Mn—ZnSe, and 12% for alloyed [$Zn_xCd_{1-x}Se$], have been achieved. However, in most cases, multiple steps are involved in the synthesis, and precise control of NC core and/or shell size remains highly challenging. In addition, surface modification is often required, which adds further complexity to the synthesis process. For (b), on the other hand, there are only very few known examples of single-phased white light emitters in bulk form, for example, [[$AgL]_n \cdot nH2O$] (L=4-cyanobenzoate), which has a quantum yield (QY) of 10.9%, in addition to several single-phased organic white light emitting materials.

SUMMARY OF THE INVENTION

The present invention addresses the foregoing issues by providing a unique family of hybrid semiconductor bulk materials as single-phased white light emitters built on ZnS semiconductors emitting bright white light. These materials are solution-processable and low-cost have high-efficiency in emitting white light, and show great promise to be used as a single-phased white-light-emitting source in a LED configuration.

In one aspect, the present invention provides an inorganic-organic hybrid semiconductor material capable of emitting white light, the material comprising a crystalline structure formed from a repeating unit, the repeating unit comprising a two-dimensional semiconducting inorganic double layer of a II-VI chalcogenide compound, wherein two opposite sides of the double layer are each attached to a layer of an organic ligand.

In one embodiment of this aspect, the II-VI chalcogenide compound of the inorganic-organic hybrid semiconductor material is characterized by formula [$M_{2(1-x)}N_{2x}Y_{2(1-y)}Z_{2y}$], wherein:

M and N are different and are each Zn or Cd;

Y and Z are each independently selected from the group consisting of S, Se and Te; and x and y are each independently 0, 1, or a fractional number between 0 and 1.

For example, the inorganic-organic hybrid semiconductor material is characterized by formula [$M_{2(1-x)}N_xY_{2(1-y)}Z_{2y}$(L)], wherein:

M and N are different and are each Zn or Cd;

Y and Z are each independently selected from the group consisting of S, Se and Te;

x and y are each independently 0, 1, or a fractional number between 0 and 1; and L is an organic ligand.

These hybrid semiconductor materials can be systematically tuned by changing compositions and/or doping with other metal elements, such as manganese, to obtain desired light-emitting or other properties.

In another aspect, the present invention provides a semiconductor device comprising the inorganic-organic hybrid semiconductor material according to any of the embodiments described above or examples described in the specification or examples below. The inorganic-organic hybrid semiconductor material can be incorporated into the semiconductor device in any manner known to a person skilled in the art.

In another aspect, the present invention provides a light-emitting device comprising the inorganic-organic hybrid semiconductor material according to any of the embodiments described above or examples described in the specification or examples below. The inorganic-organic hybrid semiconductor material can be incorporated into the light-emitting device in any manner known to a person skilled in the art, for example, through a coating method.

In another aspect, the present invention provides a method of making a light emitting device capable of emitting white light, the method comprising coating an inorganic-organic hybrid semiconductor material according to any of the embodiments described above or examples described in the specification or examples below, or a composition thereof, on the device. In particular, the inorganic-organic hybrid semiconductors of the present invention built on II-VI nanolayers are highly crystalline materials composed of two-dimensional (2D) layers of II-VI semiconductor motifs (inorganic component) that are bonded by amine molecules (organic component) to form perfectly ordered crystal lattices. They not only possess a number of enhanced semiconductor properties with respect to their parent II-VI binary compounds but also exhibit very strong structure-induced quantum confinement effect (QCE), to a higher extent than those of the smallest colloidal QDs reported to date. More significantly, they represent the first examples of single-phase white-light phosphors in bulk form of semiconductor materials. These materials have the following desirable features comparing with the CdSe NCs. First, their crystal structures are well defined and characterized; second, the infinite 2D II-VI layers may provide efficient conduction pathways for the carriers (electrons and holes), thus, attaining high transport properties; third, the crystal structures and optical properties can be systematically tuned; and moreover, these materials can be solution processed at low cost and large scale, and in bulk form with ease. In an earlier report (Ki, W. and Li, J., *J. Am. Chem. Soc.* 2008, 130, 8114.), we showed, as a concept-proving case study, that a select group of these materials, namely $Cd_2S_2$(L) (L=n-proylamine, n-butylamine, n-hexylamine), emit over the entire visible region. However, their quantum efficiencies are very low (~4-5%). One aspect of the present invention focuses on a series of $Zn_2S_2$(L)-based and Cd- and/or Se-substituted phases. In particular, the invention demonstrates that white-light emitting ternary $Zn_{2-2x}Cd_{2x}S_2(L)$ and quarternary $Zn_{2-2x}Cd_{2x}S_{2-2y}Se_{2y}(L)$ hybrid systems have significantly improved quantum yield and show strong potential for use as a new type of single-phase white light phosphors.

Thus, the invention demonstrates that Cd- and/or Se-substituted double-layer $[Zn_2S_2(ha)]$ (ha=n-hexylamine) hybrid semiconductors emit bright white light in the bulk form and their emission properties are systematically tunable. The ternary $Zn_{2-2x}Cd_{2x}S_2(ha)$ hybrid compounds exhibit two PL emission peaks, one of which being attributed to band gap emission, and the other resulting from Cd doping and surface sites. The Cd concentration modulates the optical absorption edge (band gap) and the positions of the two emission bands along with their relative intensities. The ZnS-based hybrid structures (with a nominal Cd mole fraction x=0.25) emit bright white light with significantly enhanced photoluminescence quantum yield (PLQY) compared to its CdS-based hybrid analogues. For the quaternary $Zn_{2-2x}Cd_{2x}S_{2-2y}Se_{2y}(ha)$ compounds (x=0.25 and different nominal Se mole fractions y) the synergetic effect between doped Cd and Se atoms leads to further tunability in the band gap and emission spectra, yielding well balanced white light of high quantum yield. Detailed analysis reveals that the PL emission properties of the ternary and quaternary hybrid semiconductors originate from their unique double-layered nanostructures that combine the strong quantum confinement effect and large number of surface sites. The white-light emitting hybrid semiconductors represent a new type of single-phased phosphors with great promise for use in WLEDs.

Moreover, having a white light emission QY as high as 37%, the new phosphors are approaching the performance of (YAG):Ce3+. These hybrid materials have well defined and precisely controllable crystal structure and composition. Their emission intensity, quantum efficiency and color quality can be systematically tuned. With a fluorescence quantum yield as high as 33%, coupled with excellent solution-processability, low-temperature and cost-effective one-pot synthesis, accurate stoichiometry control and high yield, they show great promise for use as a new type of WLED phosphors.

In addition, this application also discloses numerous other inorganic-organic hybrid semiconductor materials, or semiconducting and light-emitting devices prepared therefrom, through description or drawings, with their properties described or illustrated by the figures. These and other aspects of the present invention will be better appreciated through the following drawings, description, and claims.

BRIEF DESCRIPTION OF THE DRAWINGS

FIG. 6 illustrates room temperature emission spectrum of 2D-[$Zn_2S_2$(ha)] ($\lambda_{ex}$: 360 nm).

DETAILED DESCRIPTION OF THE INVENTION

Figure 1:
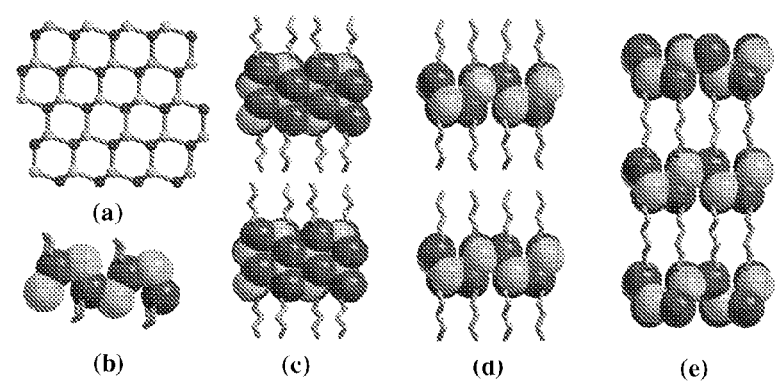
FIG. 1 illustrates views of (a) single layer of honeycomb-like net of II-VI (MQ) in the $[M_nQ_n(L)_x]$ hybrid structures, (b) single-chain 1D-[MQ(L)] structure, (c) double-layer 2D-[$M_2Q_2(L)$] structure, (d) single-layer 2D-[MQ(L)] structure, and (e) single-layer 3D-[MQ(L)$_{0.5}$] structure.

In one aspect, the present invention provides an inorganic-organic hybrid semiconductor material capable of emitting white light, the material comprising a crystalline structure formed from a repeating unit, the repeating unit comprising a two-dimensional semiconducting inorganic double layer of a II-VI chalcogenide compound, wherein two opposite sides of the double layer are each attached to a layer of an organic ligand.

In one embodiment of this aspect, the II-VI chalcogenide compound of the inorganic-organic hybrid semiconductor material is characterized by formula [$M_{2(1-x)}N_{2x}Y_{2(1-y)}Z_{2y}$] (I), wherein:

M and N are different and are each Zn or Cd;

Y and Z are each independently selected from the group consisting of S, Se and Te; and x and y are each independently 0, 1, or a fractional number between 0 and 1.

In another embodiment of this aspect, in formula (I), y is 0; and the II-VI chalcogenide compound of the inorganic-organic hybrid semiconductor material is further characterized by formula [$M_{2(1-x)}N_{2x}Y_2$] (II), wherein:

M and N are each Zn or Cd;

Y is selected from the group consisting of S, Se and Te; and x is 0, 1, or a fractional number between 0 and 1.

In another embodiment of this aspect, in formula (II), Y is S, M is Zn, and N is Cd; and the II-VI chalcogenide compound is further characterized by formula [$Zn_{2(1-x)}Cd_{2x}S_2$] (III), wherein x is 0 or a fractional number between 0 and 1.

In another embodiment of this aspect, in formula (I), x is 0, and M is Zn; and the II-VI chalcogenide compound is further characterized by formula [$Zn_2Y_{2(1-y)}Z_{2y}$] (IV), wherein:

Y and Z are each independently selected from the group consisting of S, Se and Te; and y is 0, 1, or a fractional number between 0 and 1.

In another embodiment of this aspect, in formula (IV), Y is S, and Z is Se; and the II-VI chalcogenide compound is further characterized by formula [$Zn_2S_{2(1-y)}Se_{2y}$] (V), wherein y is 0, 1, or a fractional number between 0 and 1.

In another embodiment of this aspect, in formula (I), M is Zn, N is Cd, Y is S, and Z is Se; and the chalcogenide compound is further characterized by formula [$Zn_{2(1-x)}Cd_xS_{2(1-y)}Se_{2y}$] (VI), wherein x and y are each independently a fractional number between 0 and 1.

In another embodiment of this aspect, the inorganic-organic hybrid semiconductor material is characterized by formula [$M_{2(1-x)}N_xY_{2(1-y)}Z_{2y}$(L)] (VII), wherein:

M and N are different and are each Zn or Cd;

Y and Z are each independently selected from the group consisting of S, Se and Te;

x and y are each independently 0, 1, or a fractional number between 0 and 1; and L is an organic ligand.

In another embodiment of this aspect, in formula (VII), y is 0; and the inorganic-organic hybrid semiconductor material is further characterized by formula [$M_{2(1-x)}N_{2x}Y_2(L)$] (VIII), wherein:

M and N are each independently Zn or Cd;

Y is selected from the group consisting of S, Se and Te;

L is an organic ligand; and x is 0 or a fractional number between 0 and 1.

In another embodiment of this aspect, in formula (VIII), M is Zn, and N is Cd; and the inorganic-organic hybrid semiconductor material is further characterized by formula [$Zn_{2(1-x)}Cd_xY_2(L)$] (IX), wherein Y is S or Se, and x is 0 or a fractional number between 0 and 1.

In another embodiment of this aspect, in formula (VII), x is 0, and M is Zn; and the inorganic-organic hybrid semiconductor material is further characterized by formula $[Zn_2Y_{2(1-y)}Z_{2y}(L)]$ (X), wherein:

Y and Z are each independently selected from the group consisting of S, Se and Te; and y is 0 or a fractional number between 0 and 1.

In another embodiment of this aspect, in formula (X), Y is S, and Z is Se; and the inorganic-organic hybrid semiconductor material is further characterized by formula $[Zn_2S_{2(1-y)}Se_{2y}(L)]$ (XI), wherein y is a fractional number between 0 and 1.

In another embodiment of this aspect, in formula (VII), M is Zn, N is Cd, Y is S, and Z is Se; and the inorganic-organic hybrid semiconductor material is further characterized by formula $[Zn_{2(1-x)}Cd_xS_{2(1-y)}Se_{2y}(L)]$ (XII), wherein x and y are each independently 0, 1, or a fractional number between 0 and 1.

In another embodiment of this aspect, in formula (XII), x is 0.

In another embodiment of this aspect, in formula (XII), x is a fractional number between 0 and 1.

In another embodiment of this aspect, in formula (XII), x is a number in the range of 0.1 to 0.5, inclusive.

In another embodiment of this aspect, in formula (XII), x is a fractional number selected from about 0.05, about 0.1, about 0.15, about 0.2, and about 0.25, and about 0.3.

In another embodiment of this aspect, in formula (XII), x and y are each independently selected from 0, about 0.05, about 0.1, about 0.15, about 0.2, about 0.25, and about 0.3.

In another embodiment of this aspect, in formula (XII), x is selected from 0, about 0.05, about 0.1, about 0.15, about 0.2, and about 0.25; and y is selected from 0, about 0.05, about 0.1, and about 0.15, wherein x and y are independent from each other.

To illustrate, the examples of formula $[Zn_{2(1-x)}Cd_xS_{2(1-y)}Se_{2y}(L)]$ (XII) characterizing the semiconductor materials according to the present invention include, but are not limited to, $Zn_2S_2(L)$ (x=0, y=0), $Zn_{1.9}Cd_{0.1}S_2(L)$ (x=0.05, y=0), $Zn_{1.8}Cd_{0.2}S_2(L)$ (x=0.1, y=0), $Zn_{1.7}Cd_{0.3}S_2(L)$ (x=0.15, y=0), $Zn_{1.6}Cd_{0.4}S_2(L)$ (x=0.2, y=0), $Zn_{1.5}Cd_{0.5}S_2(L)$ (x=0.25, y=0), $Zn_2S_{1.9}Se_{0.1}(L)$ (x=0, y=0.05), $Zn_{1.9}Cd_{0.1}S_{1.9}Se_{0.1}(L)$ (x=0.05, y=0.05), $Zn_{1.8}Cd_{0.2}S_{1.9}Se_{0.1}(L)$ (x=0.1, y=0.05), $Zn_{1.7}Cd_{0.3}S_{1.9}Se_{0.1}(L)$ (x=0.15, y=0.05), $Zn_{1.6}Cd_{0.4}S_{1.9}Se_{0.1}(L)$ (x=0.2, y=0.05), $Zn_{1.5}Cd_{0.5}S_{1.9}Se_{0.1}(L)$ (x=0.25, y=0.05), $Zn_2S_{1.8}Se_{0.2}(L)$ (x=0, y=0.1), $Zn_{1.9}Cd_{0.1}S_{1.8}Se_{0.2}(L)$ (x=0.05, y=0.1), $Zn_{1.7}Cd_{0.3}S_{1.8}Se_{0.2}(L)$ (x=0.15, y=0.1), $Zn_{1.6}Cd_{0.4}S_{1.8}Se_{0.2}(L)$ (x=0.2, y=0.1), $Zn_{1.5}Cd_{0.5}S_{1.8}Se_{0.2}(L)$ (x=0.25, y=0.1), $Zn_2S_{1.7}Se_{0.3}(L)$ (x=0, y=0.15), $Zn_{1.9}Cd_{0.1}S_{1.7}Se_{0.3}(L)$ (x=0.05, y=0.15), $Zn_{1.7}Cd_{0.3}S_{1.7}Se_{0.3}(L)$ (x=0.15, y=0.15), $Zn_{1.6}Cd_{0.4}S_{1.7}Se_{0.3}(L)$ (x=0.2, y=0.15), and $Zn_{1.5}Cd_{0.5}S_{1.7}Se_{0.3}(L)$ (x=0.25, y=0.15), or the like, wherein L is any of organic ligand, preferably an amine, including but limited to C2-C8 alkyl amines, for example, propylamine, butylamine, hexylamine, and octylamine, as exemplified.

In the inorganic-organic hybrid semiconductor materials characterized by any of formulae (VII) through (XII), L can be an organic ligand capable of coordinating to Zn and/or Cd to form an orderly layered structure.

Without being limited, examples of organic ligand include organic monoamines and diamines.

In one embodiment, in any of formulae (VII) through (XII), organic ligand L is an organic amine R—$NH_2$, wherein R is a $C_1$ to $C_{16}$ alkyl group.

In another embodiment, in any of formulae (VII) through (XII), the organic ligand L is an organic amine R—$NH_2$, wherein R is a $C_2$ to $C_5$ alkyl group.

In another embodiment, in any of formulae (VII) through (XII), the organic ligand L is an organic amine selected from ethylamine, propylamine, butylamine, pentylamine, hexylamine, heptylamine, octylamine, 4-picoline, 4-phenylpyridine, 4,4'-bipyridine, 1,2-bis(4-pyridyl)ethane, m-xylylenediamine, p-xylylenediamine, and aminoethylpiperazine, or the like.

In a preferred embodiment, in any of formulae (VII) through (XII), the organic ligand L is selected from the group consisting of propylamine, butylamine, hexylamine, and octylamine.

In any of the embodiments described above, the inorganic-organic hybrid semiconductor material can be, and in some embodiments preferably, doped with a small amount of Mn.

As will be described in more details in the specific experiments and examples below, the inorganic-organic hybrid semiconductor material may be doped by small amounts of Mn in the range of about 0.01 to 0.5 mol %. The amount of Mn is preferably in the range of about 0.01 to 0.2 mol %, and more preferably about 0.08 mol %.

In some embodiments, the present invention provides the inorganic-organic hybrid semiconductor materials according to any of the embodiments described above which are capable of emitting white light having CIE-1931 coordinates x and y both close to 0.31, for example, preferably in the range of 0.25 to 0.38, and more preferably in the range of about 0.28 to 0.35, and most preferably both in the range of about 0.30-0.32, or has CIE-1976 coordinate u' is in the range of about 0.15-0.25 and coordinate v' in the range of about 0.40-0.50.

The inorganic-organic hybrid semiconductor materials of the present invention according to any of the embodiments described above have high photoluminescence quantum yield (PLQY), for example, at least about 10%, preferably at least about 15%, and typically in the range of about 15% to about 40%.

In another aspect, the present invention provides a composition comprising an inorganic-organic hybrid semiconductor material according to any of the embodiments described above, and more specifically described in the specification and examples below.

In another aspect, the present invention provides a method for preparing an inorganic-organic hybrid semiconductor material according to any of the embodiments described above, as characterized by formula $[M_{2(1-x)}N_xY_{2(1-y)}Z_{2y}(L)]$, the method comprising a one-pot solvothermal reaction, wherein:

M and N are different and are each Zn or Cd;

Y and Z are each independently selected from the group consisting of S, Se and Te;

x and y are each independently 0, 1, or a fractional number between 0 and 1; and L is an organic ligand.

In one embodiment of this aspect, the one-pot solvothermal reaction comprises reacting a zinc salt, a cadmium salt, and sulfur in a proper amount ratio in a solvent.

In one embodiment of this aspect, the one-pot solvothermal reaction takes place in a reaction bomb at an elevated temperature. A preferred temperature is about 120° C.

In one embodiment of this aspect, the one-pot solvothermal reaction components further contain an amount of selenium or tellurium as desired.

Examples of the zinc and cadmium sources include their salts, including but not limited to chloride, sulfate, phosphate, nitrate, or the like. Preferred examples include $ZnCl_2$ and $CdCl_2$.

In one embodiment of this aspect, the reaction is carried in an organic solvent that can serve as the ligand in the semiconductor material, for example, an organic amine. Suitable amines include monoamines or diamines, preferably those capable of photoluminescence. Example of amines include, but are not limited to, ethylamine, propylamine, butylamine, pentylamine, hexylamine, heptylamine, octylamine, 4-picoline, 4-phenylpyridine, 4,4'-bipyridine, 1,2-bis(4-pyridyl)ethane, m-xylylenediamine, p-xylylenediamine, and aminoethylpiperazine, or the like. Preferred examples of amines include, but are not limited to, n-butylamine (ba), n-hexylamine (ha), n-propylamine (pa), and n-octylamine (oa).

In one embodiment of this aspect, the reaction components further include a small amount of manganese source, for example, a manganese salt, including but not limited to $MnCl_2$, $MnSO_4$, or the like. The doping of Mn may be carried in any other methods known in the art.

In another aspect, the present invention provides a semiconductor device comprising the inorganic-organic hybrid semiconductor material according to any of the embodiments described above or examples described in the specification or examples below. The inorganic-organic hybrid semiconductor material can be incorporated into the semiconductor device in any manner known to a person skilled in the art.

In another aspect, the present invention provides a light-emitting device comprising the inorganic-organic hybrid semiconductor material according to any of the embodiments described above or examples described in the specification or examples below. The inorganic-organic hybrid semiconductor material can be incorporated into the light-emitting device in any manner known to a person skilled in the art, for example, through a coating method.

In another aspect, the present invention provides a method of making a light emitting device capable of emitting white light, the method comprising coating an inorganic-organic hybrid semiconductor material according to any of the embodiments described above or examples described in the specification or examples below, or a composition thereof, on the device.

In addition to the embodiments described, this application also discloses numerous other inorganic-organic hybrid semiconductor materials, or semiconducting and light-emitting devices prepared therefrom, through description or drawings, with their properties described or illustrated by the figures, all of which or their variants apparent to a person skilled in the art are encompassed by the application.

The term "about", as used herein, indicates that the value modified by the term can vary by ±10%.

Solution-Processable White Light Emitting Hybrid High Semiconductor Bulk Materials with High PL Quantum Efficiency Over the past several years we have developed a novel class of inorganic-organic hybrid semiconductor bulk materials. With a general formula of $[MnQn(L)x]$ (M=Mn, Zn, Cd; Q=S, Se, Te; L=mono- or di-amine; n=1 and 2; x=0.5 and 1), these crystalline compounds are extended networks of one-, two- and three-dimensions and are composed of alternating II-VI binary semiconductor (inorganic) modules and amine molecules (organic) at nano- or sub-nanometer scale and in periodic arrangement via coordinate bonds (FIG. 1). They exhibit a number of enhanced properties over their parent II-VI semiconductors, as well as important new phenomena as a result of blending of the two distinctively different components in a single crystal lattice. These include strong structure-induced quantum confinement effect (QCE), strong absorption power, systematic and broad-band gap tunability. In addition, the low-cost and very simple one-pot synthesis, the solution processability and ease for scale-up, the well-defined and precisely-controlled crystal structures and composition, and high thermal stability (up to 200° C.), are all attractive features that make them promising candidates for various optoelectronic applications.

Previously we have demonstrated that both $[Cd_2S_2(ba)]$ and $[Cd_2Se_2(ba)]$ are capable of generating white light upon excitation with UV light and their emission properties can be tuned, see WO2009/120719 and U.S. 2011/049560, both of which are hereby incorporated by reference in their entirety for all purposes. However, these systems only serve as a concept proving case because their quantum efficiencies are very low (QY: ~4-5%). In an effort to enhance the performance of this type of materials we have further developed a series of ZnS based compounds $[Zn_2S_2(L)]$ that are built on 2D nano-modules of ZnS of a uniform layer thickness. Investigation of their emission properties reveals drastically improved quantum efficiencies over the CdQ (Q=S, Se) based hybrid structures.

Figure 2:
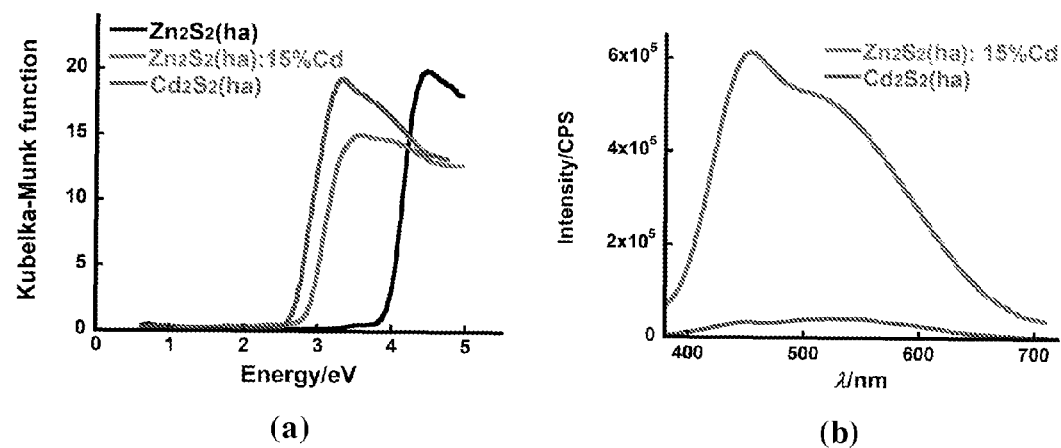
FIG. 2 illustrates (a) room temperature absorption and (b) emission spectra of double-layer [$Zn_2S_2$(ha):15% Cd] (blue) and [$Cd_2S_2$(ha)] (red) excited at a wavelength of 365 nm. Adsorption spectrum of [$Zn_2S_2$(ha)] (black) is also included as a reference.
Figure 5:
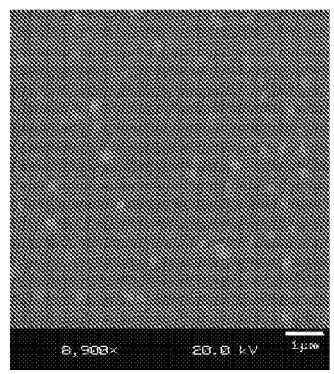
FIG. 5 illustrates SEM image of [$Zn_{1.7}Cd_{0.3}S_2$(ha)] particles in DMSO.
Figure 7:
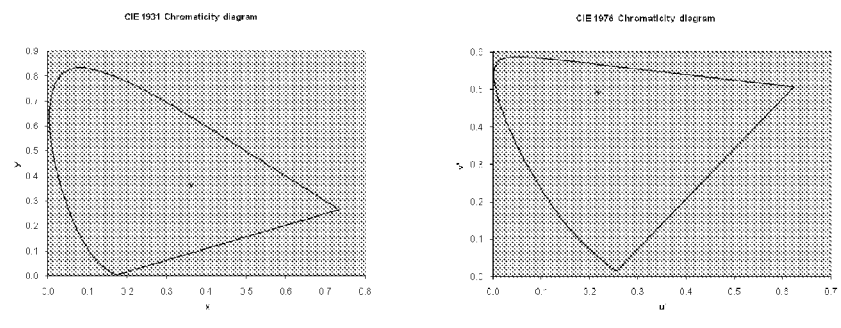
FIG. 7 illustrates CIE coordinates of (a) [$Zn_{1.7}Cd_{0.3}S_2$ (ha)] (x:0.31, y:0.29 and u':0.21, v':0.44), (b) [$Zn_{1.7}Cd_{0.3}S_2$ (oa)] (x:0.35, y:0.42 and u':0.27, v':0.50), and (c) [$Zn_{1.7}Cd_{0.3}S_2$(ha):0.08% Mn] (x:0.36, y:0.36 and u':0.21, v':0.49).

The $[Zn_2S_2(L)]$ (L=pa, ba, ha and oa) compounds crystallize in orthorhombic space groups. They feature a double-layer structure made of 2D ZnS semiconductor motifs (~8 Å in thickness) that are bonded to amine (L) molecules (FIG. 1c). One-pot solvothermal synthesis under mild conditions (e.g. 120° C.) offers pure single-phased product in high yield. All samples used in LED assemblies are solution processed in DMSO at room temperature (see FIG. 5). $[Zn_2S_2(ha)]$ (ha=hexylamine) shows a sharp optical absorption edge and its optical band gap is 3.9 eV, ~1.2 eV higher than that of its Cd analogue, $[Cd_2S_2(ha)]$ (~2.7 eV) (FIG. 2a). $[Zn_2S_2(ha)]$ emits strongly in the green-blue region with its emission peak centered at ~420 nm (FIG. 6), giving an order of magnitude increase in the emission intensity compared to that of the $[Cd_2S_2(ha)]$ analogue. An optimized composition of $[Zn_{1.7}Cd_{0.3}S_2(ha)]$ gives rise to a well-balanced white light emission, as shown in FIG. 2b. The CIE coordinates of $[Zn_{1.7}Cd_{0.3}S_2(ha)]$ is calculated to be (0.31, 0.29), well within the white region defined by the International Commission on Illumination (CIE) 1931 color space chromaticity diagram (see FIG. 7).

Figure 8:
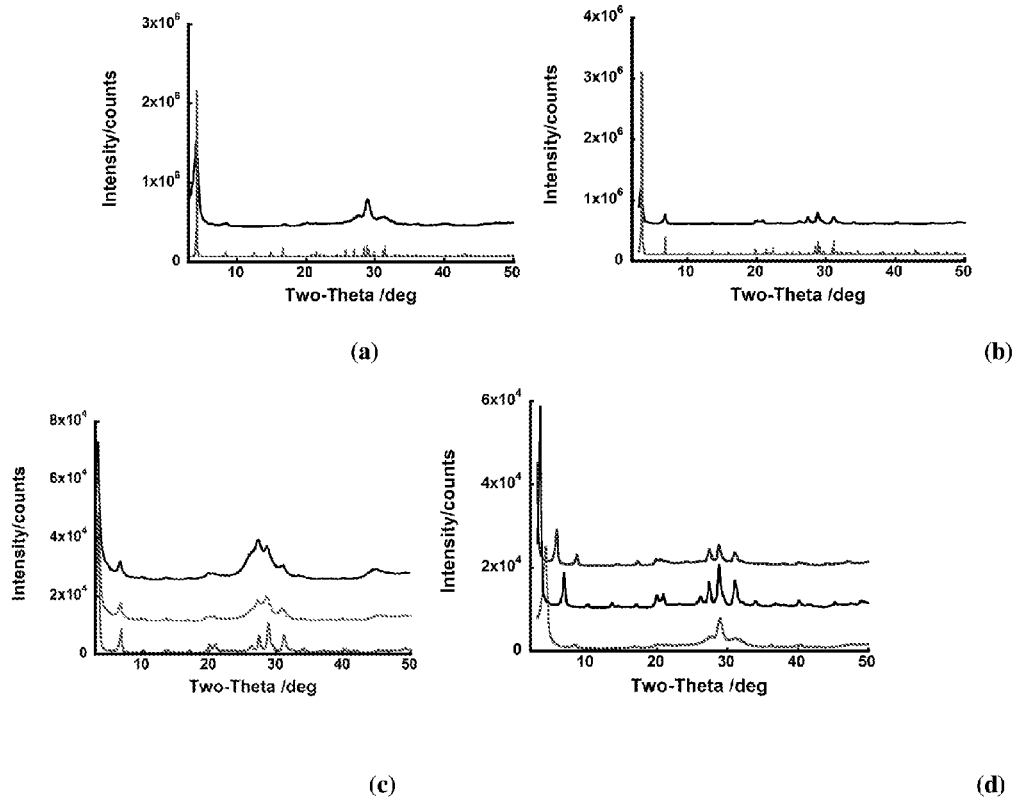
FIG. 8 illustrates observed (black) and calculated (red) PXRD patterns of the double layered (a) 2D-[$Zn_2S_2$(ba)], (b) 2D-[$Zn_2S_2$(ha)]. (c) PXRD patterns of refined 2D-[($Zn_2S_2$) (ha)] (red), 2D-[$Zn_{1.7}Cd_{0.3}S_2$(ha)] (blue), and 2D-[$Zn_{1.7}Cd_{0.3}S_2$(ha):0.08% Mn] (black), (d) Comparison of PXRD patterns of 2D-[($Zn_2S_2$)(ba)] (red), 2D-[($Zn_2S_2$)(ha)] (black), and 2D-[($Zn_2S_2$)(oa)] (blue) structures.

$[Zn_{1.7}Cd_{0.3}S_2(ha)]$ illustrates a single and sharp band edge absorption peak (FIG. 2a), from which a band gap of ~2.9 eV is estimated. Phase purity is confirmed by powder X-ray diffraction (PXRD, see FIG. 8), thermogravimetric analysis (TGA) (Table 1) and elemental analysis (EA) (Table 2), and optical absorption experiments. The very broad emission peak of $[Zn_{1.7}Cd_{0.3}S_2(ha)]$ is most likely a combined result of band edge emission, Cd substitution (FIG. S2), and also possibly contributions from the ligand modulated trap-state and surface state emission related to its 2D nanostructures.

TABLE 1

TGA data for selected samples.

| Compound | Weight Loss (%) (Cal'd) | Weight Loss (%) (expt) | Possible Residuals |
|---|---|---|---|
| $[Zn_{1.7}Cd_{0.3}S_2(ha)]$ | 32.62 | 32.03 | $Zn_{7.22}Cd_{2.77}S_{10}$, ZnS, S |
| $[Zn_{1.7}Cd_{0.3}S_2(ha)$: 0.08% Mn] | 32.63 | 32.77 | ZnS, (Zn, Mn)S, Cd |

TABLE 1-continued

TGA data for selected samples.

| Compound | Weight Loss (%) (Cal'd) | Weight Loss (%) (expt) | Possible Residuals |
|---|---|---|---|
| [Zn$_{1.7}$Cd$_{0.3}$S$_2$(oa)] | 38.21 | 35.77 | ZnS, CdS, S |
| [Zn$_{1.7}$Cd$_{0.3}$S$_2$(oa): 0.08% Mn] | 38.22 | 38.12 | ZnS, CdS, MnS, S |

TABLE 2

Summary of elemental analysis for [Zn$_{1.7}$Cd$_{0.3}$S$_2$(ha)].

| Element | Experimental | Calculated |
|---|---|---|
| C | 22.95 | 23.13 |
| H | 4.77 | 4.84 |
| N | 4.29 | 4.51 |

Figure 3:
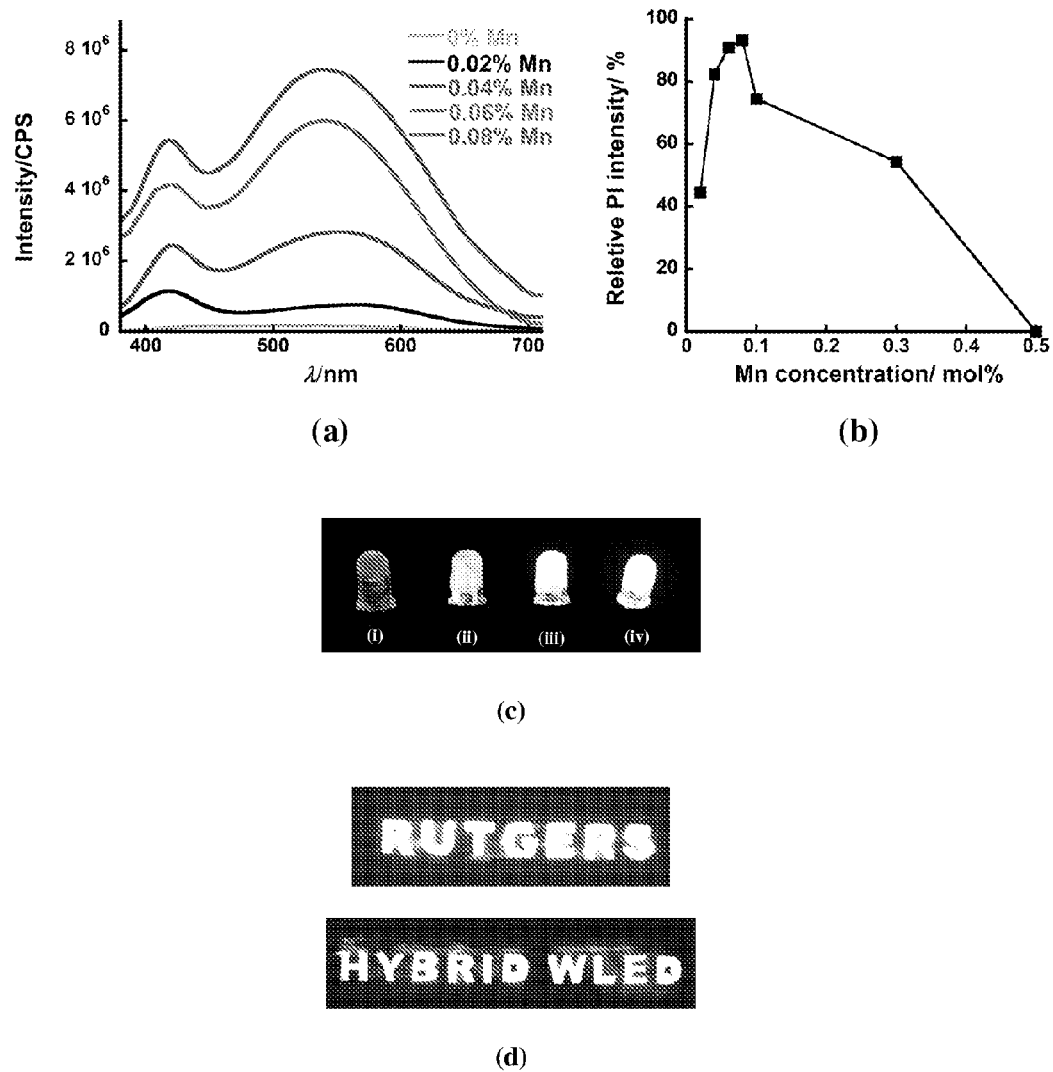
FIG. 3 illustrates (a) White light emission spectra of [$Zn_{1.7}Cd_{0.3}S_2$(ha):Mn] at various Mn concentrations ($\lambda_{ex}$=365 nm); (b) Integrated emission intensity of [$Zn_{1.7}Cd_{0.3}S_2$(ha):Mn] as a function Mn dopant amount (0.02-0.5 mol %); (c) White-light LED assemblies made by coating thin-film samples on the surface of a 5 mm reference UV LED (360 nm emission, commercially available from Le Group Fox, Inc.): (i) illuminating reference UV LED, (ii) the same LED in (i) coated with a thin layer of [$Zn_{1.7}Cd_{0.3}S_2$ (ha)] prepared in a DMSO solution (before illumination), (iii) The same LED in (ii) illuminating, and (iv) [$Zn_{1.7}Cd_{0.3}S_2$(ha):0.08% Mn] coated LED illuminating; and (d) bright white light from a [$Zn_{1.7}Cd_{0.3}S_2$(ha)] (top) and a [$Zn_{1.7}Cd_{0.3}S_2$(ha):0.08% Mn] (bottom) sample deposited on glass excited at 365 nm with a UV lamp.
Figure 9:
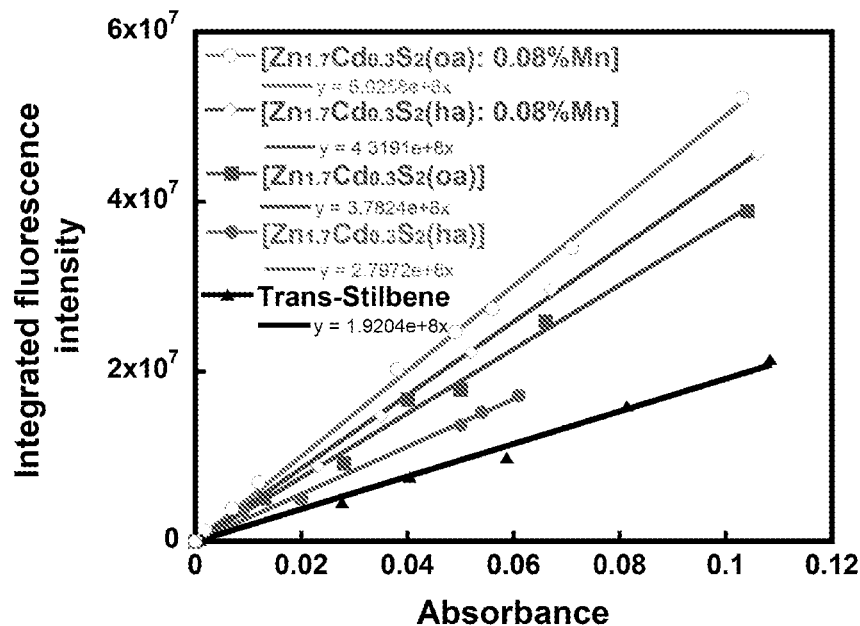
FIG. 9 illustrates linear plots of integrated fluorescence intensity vs absorbance for a standard sample, trans-stilbene in hexane and hybrid samples, 2D-[$Zn_{1.7}Cd_{0.3}S_2$(ha)], 2D-[$Zn_{1.7}Cd_{0.3}S_2$(oa)], 2D-[$Zn_{1.7}Cd_{0.3}S_2$(ha):0.08% Mn], and 2D-[$Zn_{1.7}Cd_{0.3}S_2$(oa):0.08% Mn].

The fluorescence QY of the [Zn$_{1.7}$Cd$_{0.3}$S$_2$(ha)], obtained by both relative/comparative and absolute methods on solution and solid samples (see FIG. 9 and Table 3), is in the range of 17-18%, significantly higher than those of the previously achieved values for [Cd$_2$Q$_2$(ba)] (Q=S, Se, 4-5%), and CdSe QDs (2-3%). To further improve the emission efficiency, we have examined the effect of Mn on the luminescence properties of the compounds. Previous studies have shown that Mn doping leads to both enhancement of photoluminescence intensity and tunable emission range. However, the position of the emission peak depends on the strength of the crystal field and the coordination environment of Mn$^{2+}$. In the case of [Zn$_{1.7}$Cd$_{0.3}$S$_2$(ha)], the maximum enhancement occurs at a very small amount of Mn (~0.08 mole percent). Higher or lower concentrations all give rise to reduced PL intensity (FIGS. 3a-b). Efficient energy transfer from the ZnS host to the Mn$^{2+}$ ions facilitated by mixed electronic states is responsible for the enhancement in the luminescence. The very strong confinement in the 2D layers of the hybrid systems further promotes such energy transfer. Subsequent decrease of PL intensity as the amount of Mn$^{2+}$ reaches a threshold level is due to the concentration quenching. Increase in the Mn$^{2+}$ concentration leads to the energy migration among the ions and as a result some energy will be lost in defect sites via nonradiative decays.

Figure 10:
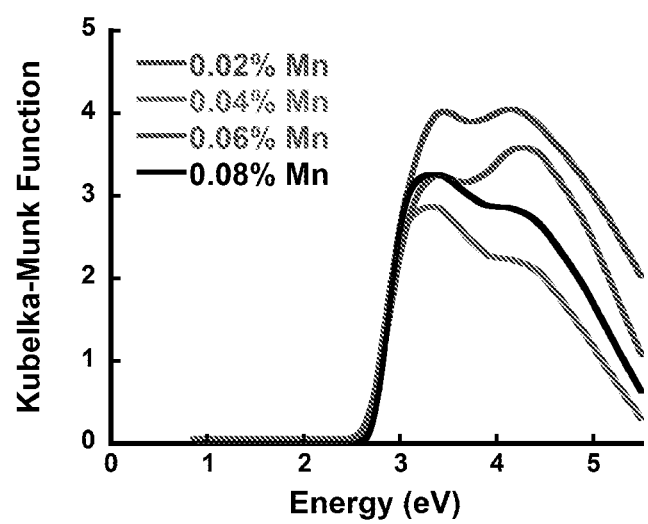
FIG. 10 illustrates room temperature absorption spectra of Mn doped $Zn_{1.7}Cd_{0.3}S_2$(ha) samples.
Figure 31:
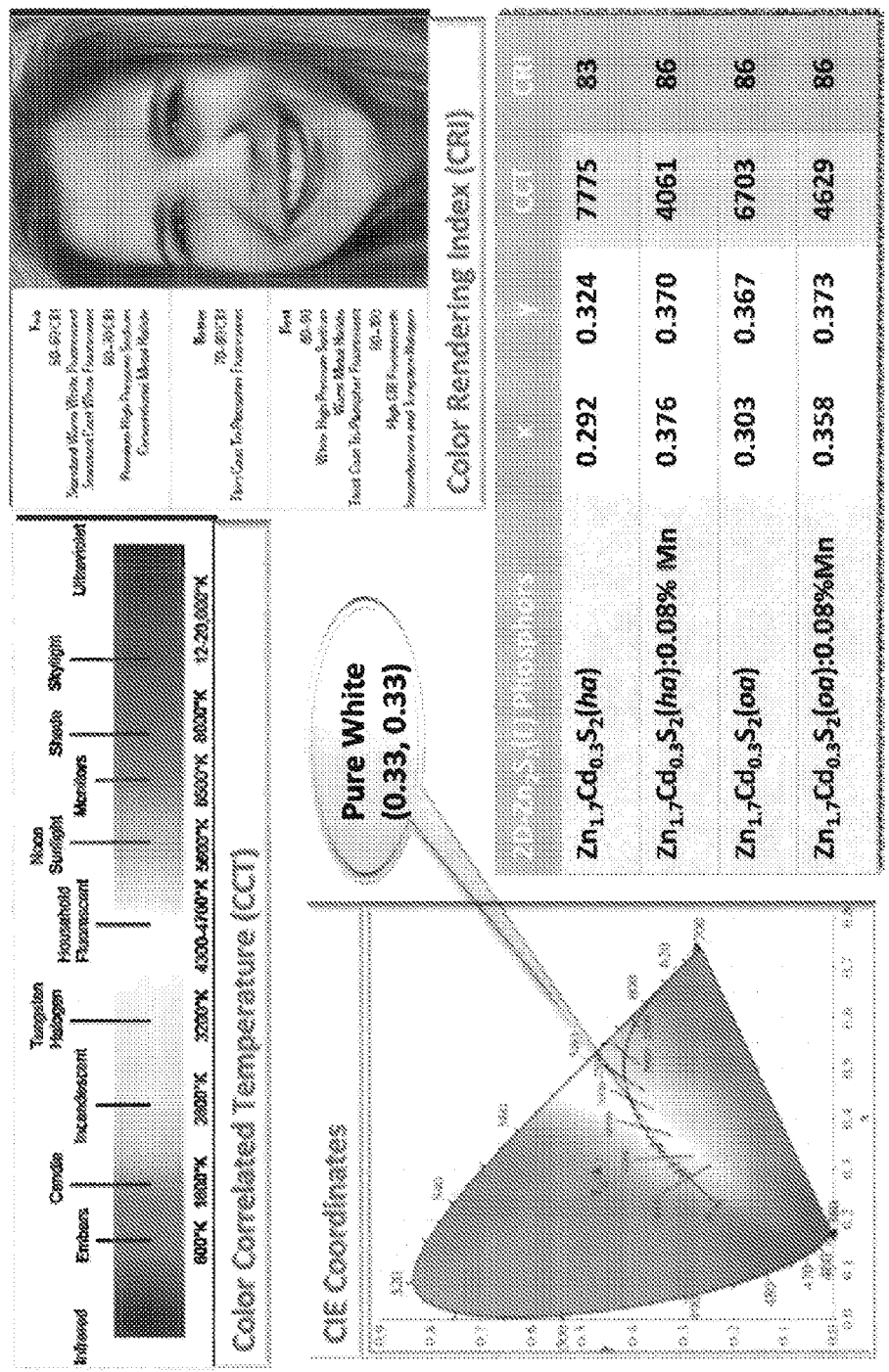
FIG. 31 illustrates data from measurements of the CIE coordinates, color correlated temperature (CCT) and color rendering index (CRI) of selected hybrid semiconductor materials, namely, [$Zn_{1.7}Cd_{0.3}S_2$(ha)], [$Zn_{1.7}Cd_{0.3}S_2$(ha): 0.08% Mn], [$Zn_{1.7}Cd_{0.3}S_2$(oa)], and [$Zn_{1.7}Cd_{0.3}S_2$(oa): 0.08% Mn].

Mn substitution leads to appreciable change in the relative peak intensities (FIG. 3a) but doesn't impose any noticeable effect on the band gap (FIG. 10). This change in the intensity distributions results in a warmer color (lower correlated color temperature, CCT) of the emitted light which gives a more yellowish appearance (FIGS. 3c-d). For the CIE coordinates, the color correlated temperature (CCT), and color rendering index (CRI) of these materials, see also FIG. 31. The fluorescence quantum yield for the [Zn$_{1.7}$Cd$_{0.3}$S$_2$(ha): 0.08% Mn] is calculated to be of 26-29%, a remarkable increase of 51-69% with respect to the undoped compound.

Figure 4:
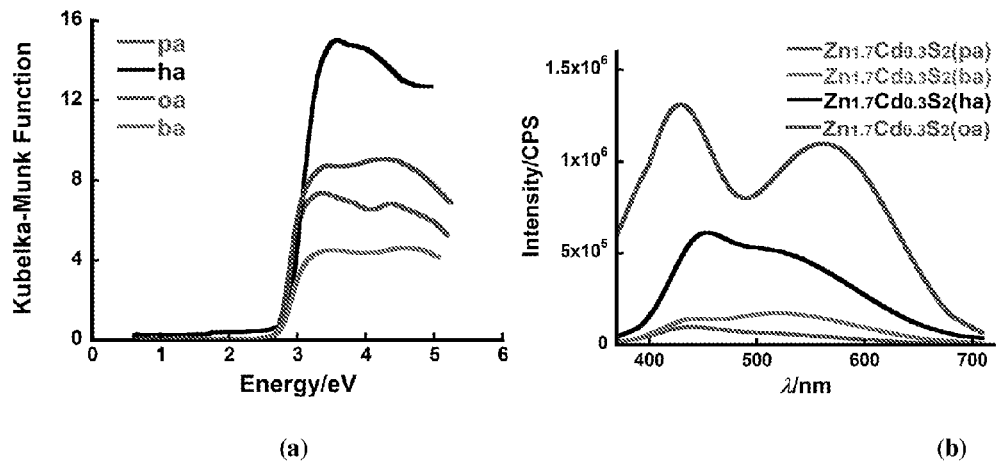
FIG. 4 illustrates room temperature absorption (a) and emission (b) spectra of [$Zn_{1.7}Cd_{0.3}S_2$(L)] (L=pa, ba, ha, oa).

To examine the effect of organic ligands on the absorption and emission behavior of the hybrid compounds, [Zn$_{1.7}$Cd$_{0.3}$S$_2$(L)] samples containing four amines with various chain length (L=propylamine (pa), butylamine (ba), hexylamine (ha), and octylamine (oa)), were synthesized and structurally characterized. As shown in FIG. 4, the PL intensity increases considerably as a function of chain length in a number of other II-VI semiconductor systems. This phenomenon may be explained by the extent of quantum confinement (QC) along the packing direction of the II-VI layers. Such a confinement leads to the formation of 2D excitons. As the length of amine molecule increases, the interlayer interactions are reduced, and thus, an enhanced quantum confinement to the 2D inorganic layers. Consequently, local carrier density of states close to Fermi energy is increased and more electrons become available, leading to the enhancement of both absorption power and PL intensity. In contrast to their strong effect on the PL emission intensity, changes in amine chain length show negligible effect on the band gap of the hybrid compounds (FIG. 4a). Fluorescence QY of 25-28% was obtained for [Zn$_{1.7}$Cd$_{0.3}$S$_2$(oa)] (C8 amine), again a significant increase (46-63%) from that of [Zn$_{1.7}$Cd$_{0.3}$S$_2$(ha)] (C6 amine). Moreover, Mn-doped (0.08 mol %) [Zn$_{1.7}$Cd$_{0.3}$S$_2$(oa)] yielded a QY of 31-37%, a value that is approaching to some of the phosphors currently used in commercial WLED productions.

In summary, in some aspects the present invention provides a new family of bulk semiconductor materials as single-phased white light emitting phosphors with high quantum efficiency. These ZnS-based crystalline inorganic-organic hybrid semiconductors have well defined and precisely controllable crystal structure and composition. Their optical emission properties, including intensity, quantum yield, and color quality, can be systematically tuned by varying the composition of both inorganic and organic components. Having fluorescence quantum yield as high as 37%, combined with excellent solution-processability, low-temperature and cost-effective one-pot synthesis, accurate stoichiometry control, and high yield, the ZnS based hybrid materials demonstrate a number of advantageous features over and QD based phosphors and (YAG):Ce$^{3+}$ phosphors that currently dominating the commercial market of WLEDs.

TABLE 3

Summary of PL quantum yields calculated based on comparative and absolute methods.

| Sample | Trial #1 (solution) | | Trial #2 (solution) | | Trial #3 (solid) | Average |
|---|---|---|---|---|---|---|
| | Absolute | Relative | Absolute | Relative | Absolute | |
| [Zn$_{1.7}$Cd$_{0.3}$S$_2$(ha)] | 17.9 | 17.3 | 17.1 | 16.6 | 18.0 | 17.4 |
| [Zn$_{1.7}$Cd$_{0.3}$S$_2$(ha):0.08% Mn] | 28.6 | 26.3 | 28.0 | 27.0 | 29.1 | 27.8 |
| [Zn$_{1.7}$Cd$_{0.3}$S$_2$(oa)] | 27.4 | 25.3 | 26.7 | 24.8 | 28.3 | 26.5 |
| [Zn$_{1.7}$Cd$_{0.3}$S$_2$(oa):0.08% Mn] | 36.5 | 33.3 | — | — | 37.3 | 35.7 |

Tuning and Enhancing White Light Emission of II-VI Based Inorganic-Organic Hybrid Semiconductors as Single-Phased Phosphors
Structure and Optical Emission Properties of Binary $Zn_2S_2$ (L)

Figure 11:
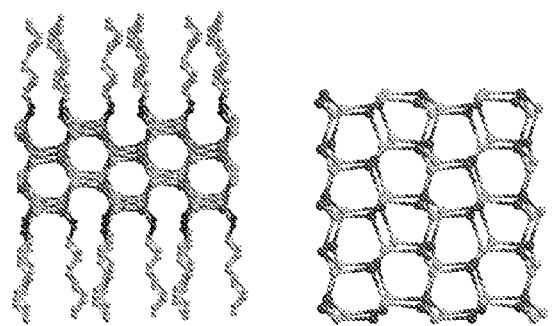
FIG. 11 illustrates the crystalline structures of the hybrid compounds: (a) Side view of the double-layer 2D-[$Zn_2S_2$ (ha)] based crystal structure, (b) The double layer of ZnS in 2D-[$Zn_2S_2$(ha)]. The light blue balls are Zn; Red balls, S; blue balls, N; gray balls, C. Hydrogen atoms are omitted for clarity.

The crystal structure of $Zn_2S_2$(ha) simulated based on that of $Zn_2Se_2$(ba) is illustrated in FIG. 11(a), and a view of the double layer [$Zn_2S_2$] is displayed in FIG. 11(b). $Zn_2S_2$(ha) is composed of double-layer [$Zn_2S_2$] slabs, and the slabs are sandwiched by coordinated n-hexylamine. All Zinc atoms have tetrahedral coordination. There are two crystallographic independent Zn atoms, one of which bonds to four S atoms to form a distorted tetrahedron, and the other coordinates to three S atoms and one N atom of n-hexylamine molecule. The double layer [$Zn_2S_2$] slab can be regarded as a "slice" cut from the (110) crystal plane of the hexagonal structure of ZnS (or wurtzite structure). The thickness of the double-layer [$Zn_2S_2$] slab has been estimated to be far less than the exciton Bohr radius of ZnS (2.4 nm), which results in very strong confinement of electrons/holes in the c direction and the formation of 2D exciton analogous to semiconductor superlattices.

Figure 12:
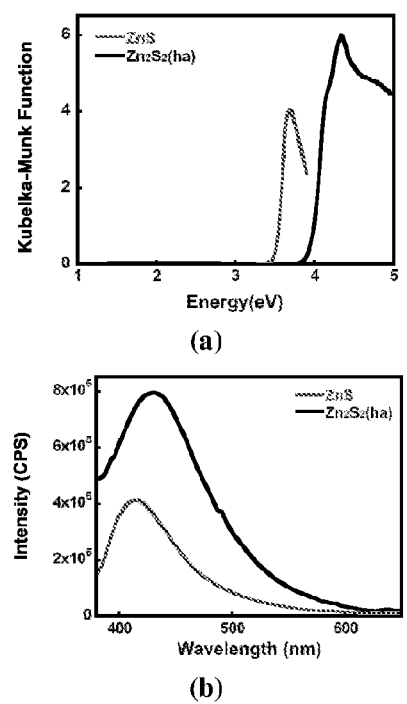
FIG. 12 illustrates (a) room temperature optical absorption spectra of 2D-[$Zn_2S_2$(ha)] and reference ZnS, obtained from diffuse reflectance data; and (b) room temperature PL emission spectra of 2D-[$Zn_2S_2$(ha)] and reference ZnS ($\lambda_{ex}$=360 nm). The intensity of the hybrid structure is doubled with respect to that of ZnS.
Figure 21:
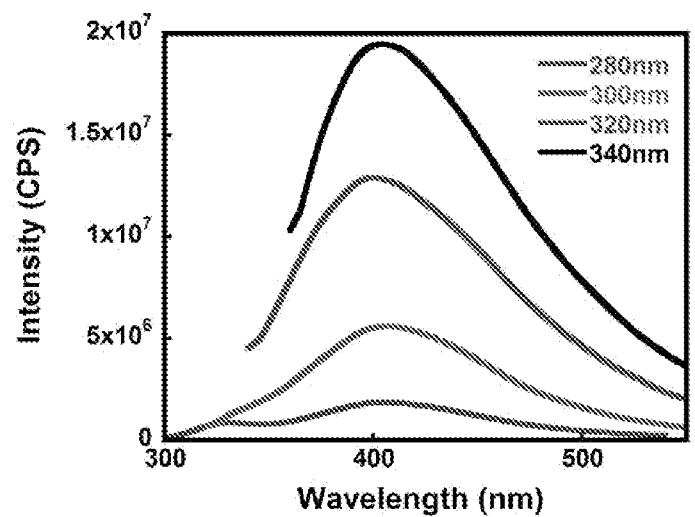
FIG. 21 illustrates PL emission spectra of $Zn_2S_2$(ha) excited at different wavelengths.

The optical absorption spectra obtained from diffuse reflectance and the room temperature photoluminescence (PL) emission spectra of $Zn_2S_2$(ha) and the reference ZnS are shown in FIGS. 12a and 12b, respectively. Compared to 3.5 eV of ZnS, the absorption edge of $Zn_2S_2$(ha) is estimated to be 4.0 eV, indicating a blue shift of 0.5 eV (FIG. 12a). The blue-shift is due to the QCE induced in the layered nanostructure of $Zn_2S_2$(ha). At an excitation energy of 360 nm, $Zn_2S_2$(ha) and ZnS exhibit a similar emission profile, with one broad peak centered at 430 and 420 nm, respectively (FIG. 12b). It has been reported that the nanosized ZnS particles prepared inside MCM-41 hosts with and without ethylenediamine (en) as functional group show one emission peak centered at ~430 and ~450 nm, respectively, which is attributed to the defects related to sulfur vacancies. The inorganic/organic $ZnS/NaSCH_2COONa$ nanocomposite synthesized under hydrothermal conditions gives a blue emission peak at ~425 nm, which is ascribed to the sulfur vacancies. Pure ZnS nanoparticles often exhibit only a luminescent peak in the range of 450-420 nm. Analogously, the PL emission band at 430 nm for $Zn_2S_2$(ha) may also be attributed to the presence of the sulfur vacancies in the double layer [$Zn_2S_2$] slabs. $Zn_2S_2$(ha) exhibits much stronger emission intensity over ZnS. Such luminescence-enhancement effect has been studied in the ZnS-en-MCM-41 mesoporous nanosized composites and $Zn_{1-x}Mn_xSe(L)_{1/2}$ and $Cd_{1-x}Mn_xSe(L)_{1/2}$ (L=diamines) 2D-dilute magnetic semiconductors. These studies indicate that diamines (as Lewis bases for $Zn^{2+}$ and $Mn^{2+}$ ions) can act as electron donors to reduce the nonradioactive decay, thus enhancing dramatically the PL intensity. For the present work, n-hexylamine molecule not only is a Lewis base for $Zn^{2+}$ ions but also directly coordinates with Zn atoms to form the Zn—N bonds in the $Zn_2S_2$(ha) crystal lattice. We infer that n-hexylamine can also act as an electron donor to reduce the nonradiative decay through the Zn—N bonds. In addition, unlike the reference ZnS, the organic and inorganic interface in the two-dimensional $Zn_2S_2$(ha) hybrid structure can induce strong interactions between the ZnS slabs and the organic amines and more sulfur vacancies. Consequently, a considerable enhancement of the PL intensity for $Zn_2S_2$(ha) over ZnS has been observed. At higher excitation energies (e.g. 280 nm), band gap emission is also observed with a very low intensity (FIG. 21).

Figure 22:
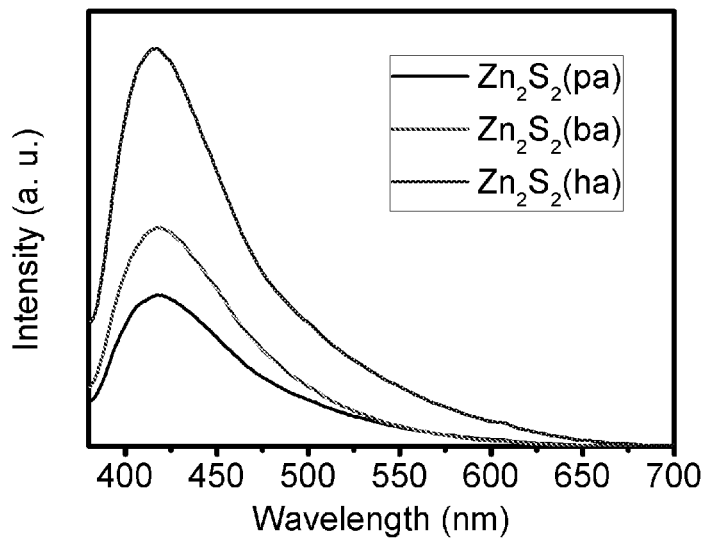
FIG. 22 illustrates PL emission spectra of $Zn_2S_2$(pa), $Zn_2S_2$(ba), and $Zn_2S_2$(ha) $\lambda_{ex}$=360 nm).

The emission intensity of [$Zn_2S_2$](L) is enhanced monotonically as the length of L increases from pa and ba to ha (FIG. 22). These monoamines act as spacers between, and induce confinement within, the [$Zn_2S_2$] layers. The confined luminescence in the 2D [$Zn_2S_2$] layers is similar to that in quantum wells or superlattices. Longer amine molecules give rise to larger [$Zn_2S_2$] interlayer distance, which further weakens the interlayer interactions. Consequently, the confinement effect of the PL process becomes more prominent, which contributes to the luminescence enhancement.

Structure and Optical Emission Properties of Ternary $Zn_{2-2x}Cd_{2x}S_2$(ha)

Figure 13:
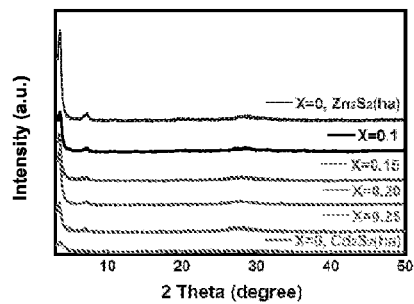
FIG. 13 illustrates PXRD patterns of the Cd substituted $Zn_{2-2x}Cd_{2x}S_2$(ha) hybrid compounds with the nominal Cd mole fractions (x) of 0.10, 0.15, 0.20, and 0.25, respectively, together with those of $Zn_2S_2$(ha) (x=0) and $Cd_2S_2$(ha) (x=1).

Plotted in FIG. 13 are the PXRD patterns of the Cd substituted $Zn_{2-2x}Cd_{2x}S_2$(ha) hybrid compounds with the Cd mole fractions (x) of 0.10, 0.15, 0.20, and 0.25, respectively, together with those of $Zn_2S_2$(ha) (x=0) and $Cd_2S_2$(ha) (x=1). Since $Zn_2S_2$(ha) and $Cd_2S_2$(ha) are isostrucutural phases, they are expected to have similar PXRD patterns, with small difference in their diffraction peaks. $Zn_2S_2$(ha) shows three diffraction peaks located at 3.4°, 7.24°, and 28.74° (2θ), respectively, while the corresponding peaks for $Cd_2S_2$(ha) are found at 3.6°, 26.68°, and 29.04°, respectively. As shown in FIG. 13, the PXRD patterns of the ternary $Zn_{2-2x}Cd_{2x}S_2$(ha) compounds are almost identical to that of $Zn_2S_2$(ha), having their first diffraction peaks at ca. 3.5° (2θ). This confirms that Cd substituted $Zn_{2-2x}Cd_{2x}S_2$(ha) compounds have the same layered nanostructure as that of [$Zn_2S_2$](ha). No other peaks appear in their PXRD patterns, indicating that samples are in high purity. In addition, the intensities of the first diffraction peaks for the $Zn_{2-2x}Cd_{2x}S_2$(ha) hybrid compounds gradually decrease with the increase in x from 0, 0.1, 0.15, 0.2, and 0.25 to 1, and $Cd_2S_2$(ha) (x=1) has the lowest intensity, which suggests a decline in crystallinity with increasing x.

Figure 14:
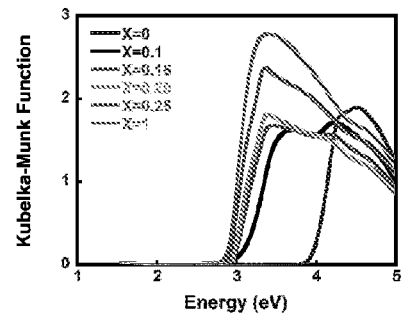
FIG. 14 illustrates optical absorption spectra of the Cd substituted $Zn_{2-2x}Cd_{2x}S_2$(ha) hybrid compounds with the nominal Cd mole fractions (x) of 0.10, 0.15, 0.20, and 0.25, respectively, together with those of $Zn_2S_2$(ha) (x=0) and $Cd_2S_2$(ha) (x=1).

The band gaps of the ternary $Zn_{2-2x}Cd_{2x}S_2$(ha) are very sensitive to the Cd content. Even a small amount of x leads to a large red shift in their optical absorption edge (FIG. 14). Specifically, the band gap of $Zn_{2-2x}Cd_{2x}S_2$(ha) is estimated to be 3.15, 3.05, 3.0, and 2.95 eV for x=0.1, 0.15, 0.2, and 0.25, respectively (see Table 4). Note at x=0.25, the band gap of $Zn_{2-2x}Cd_{2x}S_2$(ha) is nearly the same as that of the binary $Cd_2S_2$(ha) (x=1). Thus, substitution of Zn by a nominal amount of Cd can effectively modulate the band gap of a ternary phase. Considering the fact that $Cd_2S_2$(ha) is synthesized at 50° C., a much lower temperature than that of $Zn_2S_2$(ha) (120° C.), substitution of Zn by Cd in the double layer [$Zn_2S_2$] slabs can be readily achieved. Moreover, similar to $Zn_2S_2$(ha) and $Cd_2S_2$(ha), ternary $Zn_{2-2x}Cd_{2x}S_2$(ha) phases with various x values exhibit sharp and single absorption edges between those of $Zn_2S_2$(ha) and $Cd_2S_2$(ha) (FIG. 14), confirming that there is no phase separation throughout the entire composition range (x=0 to 1).

TABLE 4

Optical absorption edges and PL emission peaks of the $Zn_{2-2x}Cd_{2x}S_2$(ha) hybrid compounds ($\lambda_{ex}$ = 360 nm).

| Nominal Cd mole fraction (x) | 0 [$Zn_2S_2$(ha)] | 0.15 | 0.2 | 0.25 | 1 [$Cd_2S_2$(ha)] |
|---|---|---|---|---|---|
| Estimated band gap (eV) | 4.0 | 3.05 | 3.0 | 2.95 | 2.9 |
| PL emission 1st peak (nm) | 430 | 408 | 410 | 420 | none |
| 2nd peak (nm) | none | 500 | 510 | 530 | 530 |

Figure 15:
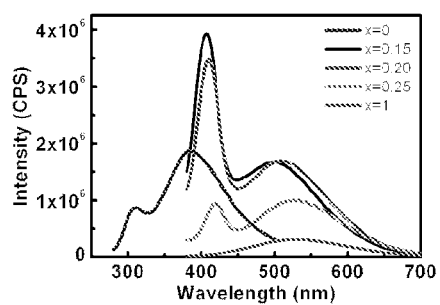
FIG. 15 illustrates room temperature PL emission spectra ($\lambda_{ex}$=360 nm) of $Cd_2S_2$(ha) (x=1) and the Cd substituted $Zn_{2-2x}Cd_{2x}S_2$(ha) hybrid compounds with the nominal Cd mole fractions (x) of 0.15, 0.20, and 0.25, respectively, together with that of ($\lambda_{ex}$=280 nm) of $Zn_2S_2$(ha) (x=0).
Figure 23:
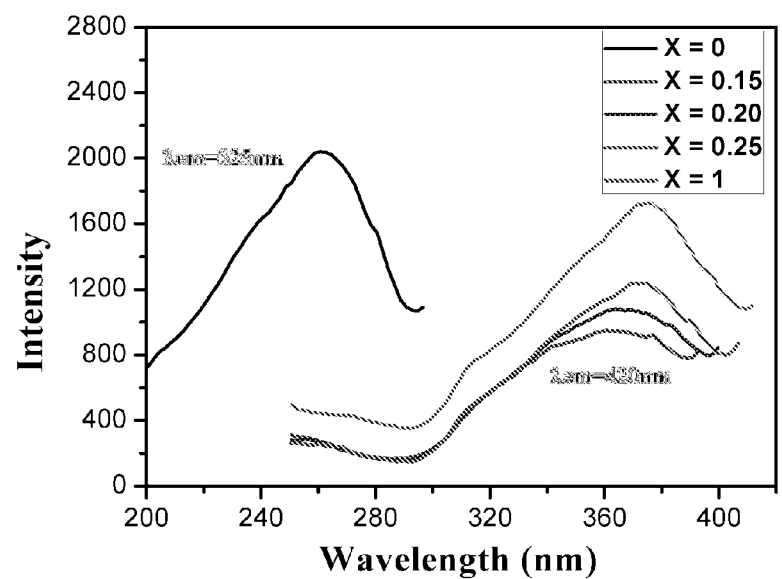
FIG. 23 illustrates PLE spectra of $Zn_{2-2x}Cd_{2x}S_2$(ha) (x=0.15, 0.20, and 0.25) and $Cd_2S_2$(ha) (x=1) ($\lambda_{em}$=420 nm), together with that of $Zn_2S_2$(ha) (x=0) ($\lambda_{em}$=325 nm).

The absorption edges of $Zn_{2-2x}Cd_{2x}S_2$(ha) and $Cd_2S_2$(ha) are around 3 eV, far away from 4.0 eV of $Zn_2S_2$(ha) (FIG. 14). The room temperature PL excitation (PLE) spectra of the ternary $Zn_{2-2x}Cd_{2x}S_2$(ha) hybrid compounds (x=0.15, 0.20, and 0.25) and $Cd_2S_2$(ha) (x=1) were measured with the emission wavelength fixed at 420 nm, while that of $Zn_2S_2$ (ha) (x=0) was measured with the emission wavelength fixed at 325 nm. The obtained PLE spectra (FIG. 23) indicate that the suitable excitation wavelength range for the ternary $Zn_{2-2x}Cd_{2x}S_2$(ha) hybrid compounds and binary $Cd_2S_2$(ha) are quite different from that for $Zn_2S_2$(ha). Consequently, the room temperature PL emission spectra of the ternary $Zn_{2-2x}Cd_{2x}S_2$(ha) hybrid compounds (x=0.15, 0.20, and 0.25) and $Cd_2S_2$(ha) (x=1) were measured at the excitation wavelength of 360 nm, while that of $Zn_2S_2$(ha) was measured at the excitation of 280 nm. As shown in FIG. 15, the $Cd_2S_2$(ha) phase emits white light and shows one broad and low-intensity emission peak (maximum at ~530 nm) that covers the entire visible spectrum. As previously stated, the 2D double-layered cadmium based $Cd_2S_2$(L) (L=monoamine) hybrid compounds have a large number of surface sites within each crystal due to the nature of its layered structure, and the broad white light emission for $Cd_2S_2$(L) is attributed predominantly to the recombination of the charge carriers within surface states. Different from previously reported $Cd_2S_2$(L), where band gap emission was recognizable (Ki, W. and Li, J., *J. Am. Chem. Soc.* 2008, 130, 8114), the band gap emission is not recognizable in the $Cd_2S_2$(ha), largely due to its very low overall intensity. All ternary $Zn_{2-2x}Cd_{2x}S_2$(ha) compounds show two PL emission peaks with significantly enhanced emission intensities compared to $Cd_2S_2$(ha), which are centered at 408 and 500 nm for x=0.15, 410 and 510 nm for x=0.20, and 420 and 530 nm for x=0.25, respectively (see Table 4). The first (high energy) peak in all cases is attributed to the band gap emission, and the intensity decreases as x value increases. A red shift is observed as a function of increasing x. The first emission peak of the $Zn_{2-2x}Cd_{2x}S_2$(ha) compounds are at 408, 410 and 420 nm for x=0.15, 0.20 and 0.25, respectively. This lowering in emission energy is a result of band gap decrease as the content of Cd increases, which is also confirmed from their optical absorption edges shown in FIG. 14. Moreover, we also observe a red shift in the second emission peaks of the $Zn_{2-2x}Cd_{2x}S_2$(ha) ternary compounds, from 500, 510 to 530 nm as x increases from 0.15, 0.20 to 0.25, respectively. The second emission peak of the $Zn_{2-2x}Cd_{2x}S_2$(ha) hybrid compound with x of 0.25 is very close to that of $Cd_2S_2$(ha), following the same trend as in their optical absorption edges. Analogous to the $Cd_2S_2$(L) system, we infer that the second emission band of the ternary $Zn_{2-2x}Cd_{2x}S_2$(ha) hybrids results from the substituted Cd atoms in the double-layer $[Zn_{2-2x}Cd_{2x}S_2]$ slabs and the surfaces sites related to their layered structure. The increase of the Cd content results in the red-shift. Moreover, the PL emission spectrum of $Zn_2S_2$ (ha) measured at the excitation wavelength of 280 nm also exhibits two emission peaks, one of which is located at 325 nm corresponding to band gap emission, and the other peak may originate from the presence of the sulfur vacancies in the double layer $[Zn_2S_2]$ slabs, as described above.

It has been reported that the band-edge emission with narrow spectral width dominates the PL emission feature of the high-quality alloyed $Zn_xCd_{1-x}S$ nanocrystals (quantum dots) synthesized at high temperatures, which is associated with the QCE of the charge carriers in all three dimensions due to their particle radius close to their corresponding Bohr radii. And it has been observed that the original deep-trap emission ranging from 500 to 600 nm is gradually eliminated with the increase in the high-temperature annealing time owing to the removal of the crystallite defects within the nanocrystals. On the other hand, the $Cd_xZn_{1-x}S$ nanoparticles prepared at room temperature exhibit only one broad emission peak centered at 480, 505, 540, 543, and 550 nm for $Cd_{0.1}Zn_{0.9}S$, $Cd_{0.22}Zn_{0.78}S$, $Cd_{0.72}Zn_{0.28}S$, $Cd_{0.80}Zn_{0.20}S$, and $Cd_{0.95}Zn_{0.05}S$, respectively, which accordingly corresponds to the deep-trap emission related to the crystallite defects within the nanoparticles. Obviously, the ternary $Zn_{2-2x}Cd_{2x}S_2$(ha) hybrid compounds combine the two features, one of which ($1^{st}$ peak) is similar to the alloyed $Zn_xCd_{1-x}S$ QDs synthesized at high temperatures, and the other ($2^{nd}$ peak) is just like the nanoparticles synthesized at room temperature. Such a phenomenon is most likely originated from their unique layered nanostructure combing with the strong QCE and large surface sites. Since the Cd substituted compounds $Zn_{2-2x}Cd_{2x}S_2$(ha) have the same layered nanostructure as that of $[Zn_2S_2]$(ha), the same QCE exists in $Zn_{2-2x}Cd_{2x}S_2$(ha), which leads to the first emission peaks that are attributed to band gap emission. Since $[Zn_2S_2]$(ha) doesn't exhibit any emission peak between 500 and 550 nm, it can be inferred that the second emission peak ranging from 500 to 530 nm in the $Zn_{2-2x}Cd_{2x}S_2$(ha) ternary compounds is associated with the doped Cd atoms in the double-layer $[Zn_{2-2x}Cd_{2x}S_2]$ slabs, along with some defects related to the surfaces sites, similar to the $Cd_xZn_{1-x}S$ nanoparticles prepared at room temperature. The well-defined Cd ion related broad emission is either attributable to direct band-to-band recombination in CdS-based phases or due to recombination of $Cd^{2+}$ ions as an impurity center. The PXRD analysis shows that there is no phase separation, and that Cd ions are indeed doped onto the double-layer $[Zn_2S_2]$ slabs. Consequently, the second emission peak in $Zn_{2-2x}Cd_{2x}S_2$(ha) should be attributed to the recombination of $Cd^{2+}$ ions as an impurity center. The increase of the Cd content results in the red-shift, similar to the red shift in the broad emission peak of the $Cd_xZn_{1-x}S$ nanoparticles prepared at room temperature. Significantly different from the magic-size CdSe NCs, the surface sites of the hybrid nano-structured compounds are produced by the nature of their double-layered structure, not by chance.

Figure 24:
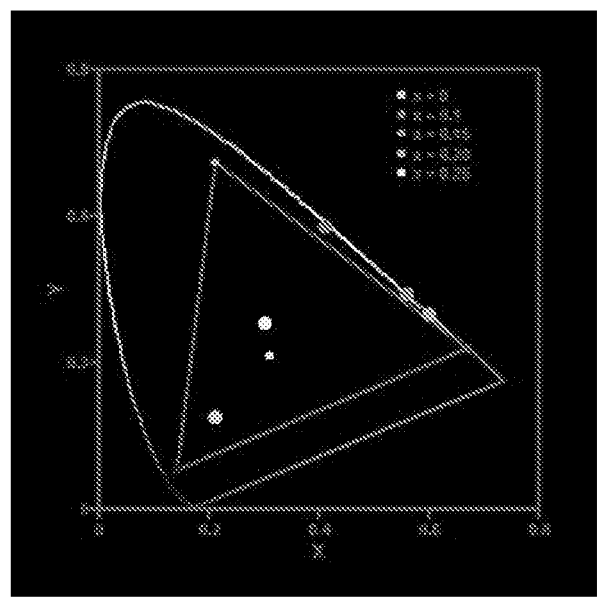
FIG. 24 illustrates CIE diagram showing the chromaticity coordinates for the ternary $Zn_{2-2x}Cd_{2x}S$(ha) hybrid compounds with the nominal Cd mole fraction (x) of 0, 0.10, 0.15, 0.20, and 0.25, respectively.

The intensity of the $2^{nd}$ emission peak of the $Zn_{2-2x}Cd_{2x}S_2$ (ha) hybrid is considerably higher than that of the broad emission of $Cd_2S_2$(ha) at ~530 nm. One of the possible reasons for the very low emission intensity of $Cd_2S_2$(ha) is its low crystallinity (FIG. 13). Materials with higher crystallinity will more likely possess less nonradiative recombination centers, leading to an increase in their PL emission intensity. The overall emission intensity for $Zn_{2-2x}Cd_{2x}S_2$ (ha) gradually decreases as the Cd content increases. Such a decrease in the PL emission intensity is also observed for the $Cd_xZn_{1-x}S$ nanoparticles prepared at room temperature. We attribute the lowering in the PL emission to the lattice mismatch induced by doping Cd atoms into the $[Zn_2S_2]$ slabs. The defects originated from the lattice mismatch can act as the nonradiative recombination centers, resulting in the decrease in PL emission. Consequently, $Zn_{2-2x}Cd_{2x}S_2$ (ha) is superior in PL emission intensity over $Zn_2S_2$(ha) (x=0) and $Cd_2S_2$(ha) (x=1), and its emission can be well modulated and balanced by controlling the x values. The CIE coordinates of various $Zn_{2-2x}Cd_{2x}S_2$(ha) can be tuned by changing the composition (FIG. 24). The CIE coordinates for the $Zn_{2-2x}Cd_{2x}S_2$(ha) hybrid compound with x=0.25 are calculated to be (0.30, 0.38), which are well within the white-light region. With a photoluminescence quantum yield (PLQY) measured to be as high as 9.9%, this compound demonstrates a considerable increase (doubling) in its emission efficiency compared to the $Cd_2S_2$(ba)-based white light emitters (4-5%).

Structure and Optical Emission Properties of Quaternary $Zn_{2-2x}Cd_{2x}S_{2-2y}Se_{2y}$(ha)

Figure 16:
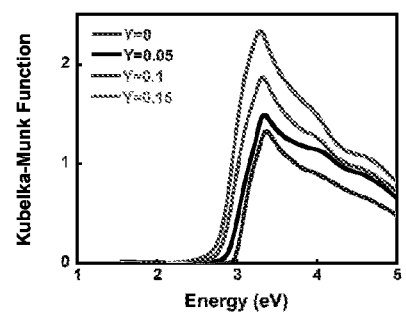
FIG. 16 illustrates optical absorption spectra of the $Zn_{1.6}Cd_{0.4}S_{2-2y}Se_{2y}$(ha) (y=0, 0.05, 0.10, and 0.15) compounds.
Figure 25:
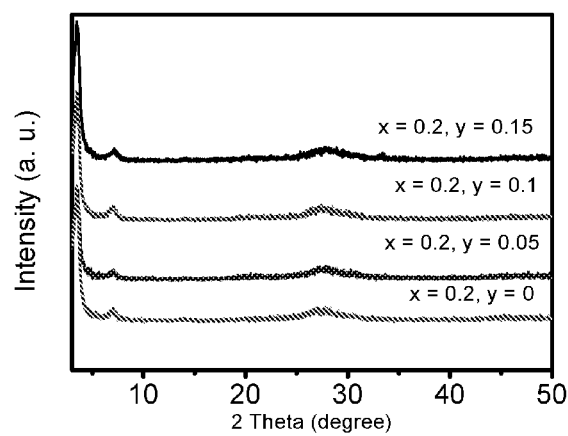
FIG. 25 illustrates PXRD patterns of the quaternary $Zn_{2-2x}Cd_{2x}S_{2-2y}Se_{2y}$(ha) hybrid compounds with the nominal Cd mole fraction (x) fixed at 0.20 and the nominal Se mole fraction (y) of 0, 0.05, 0.10, and 0.15, respectively.
Figure 26:
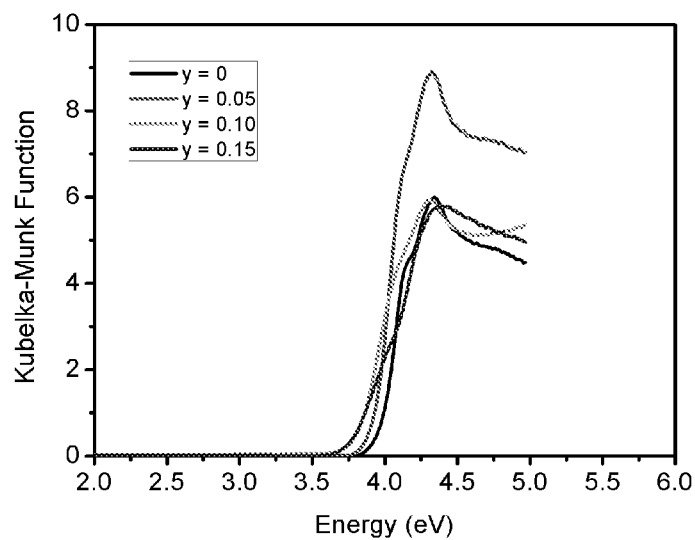
FIG. 26 illustrates optical absorption spectra of the Se substituted $Zn_2S_{2-2y}Se_{2y}$(ha) compounds with the nominal Se mole fraction of 0, 0.05, 0.10, and 0.15, respectively, which were synthesized at 120° C.
Figure 27:
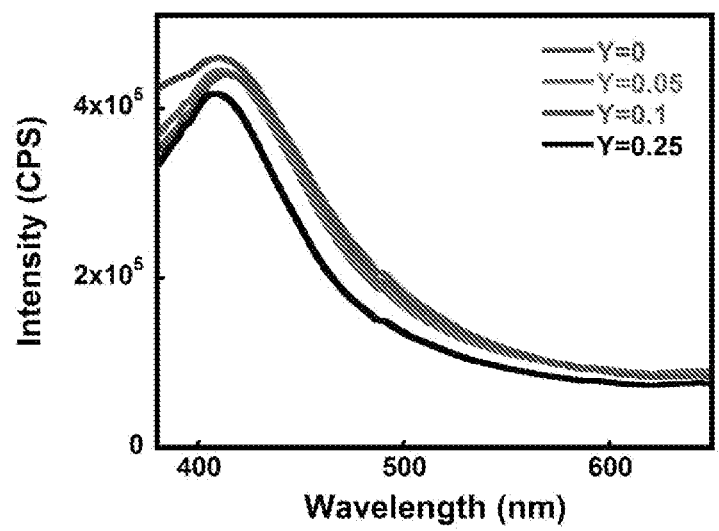
FIG. 27 illustrates room temperature PL emission spectra ($\lambda_{ex}$=360 nm) of the Se substituted $Zn_2S_{2-2y}Se_{2y}$(ha) compounds with the nominal Se mole fraction of 0, 0.05, 0.10, and 0.15, respectively, which were synthesized at 120° C. for 2 days.

At a fixed Cd mole fraction x=0.20, Cd and Se co-substituted quaternary $Zn_{2-2x}Cd_{2x}S_{2-2y}Se_{2y}$(ha) hybrid compounds with the nominal Se mole fractions (y) of 0.05, 0.10, and 0.15, respectively, are synthesized at 120° C. (2 days). The PXRD patterns of the quaternary $Zn_{2-2x}Cd_{2x}S_{2-2y}Se_{2y}$(ha) (x=0.20, y=0.05, 0.10, and 0.15, respectively) compounds are nearly identical to that of $Zn_{1.6}Cd_{0.4}S_2$(ha) (x=0.20) (FIG. 25), which clearly indicates that the $Zn_{2-2x}Cd_{2x}S_{2-2y}Se_{2y}$(ha) compounds are single-phased and possess the same layered nanostructure as the ternary $Zn_{2-2x}Cd_{2x}S_2$ (ha). FIG. 16 displays the optical absorption spectra of the $Zn_{2-2x}Cd_{2x}S_{2-2y}Se_{2y}$(ha) (x=0.20, y=0, 0.05, 0.10, and 0.15, respectively) compounds. Again, their absorption edge gradually shifts to lower energy with an increasing y value. The estimated band gaps of $Zn_{1.6}Cd_{0.4}S_{2-2y}Se_{2y}$(ha) (x=0.20) are 2.85, 2.80 and 2.75 eV for y=0.05, 0.10 and 0.15, respectively (see Table 5). Compared with the band gap of the ternary $Zn_{2-2x}Cd_{2x}S_2$(ha) (x=0.20) reference structure, 3.0 eV, the extent of red shift here is relatively small. Interestingly, the absorption intensity increases monotonically as a function of y to a much larger extent. It is also interesting to note that Se substitution makes negligible effect on the band gap and emission properties of the binary $Zn_2S_2$(ha) structures prepared at the same conditions (120° C. for 2 days, see FIGS. 26 and 27). This observation is quite different from the alloyed $ZnS_xSe_{1-x}$ nanowires that exhibit the tunable band-gap emissions through composition (x) modulation. Since 2D-[$Zn_2Se_2$(ha)] was synthesized at 140° C., a higher temperature than 120° C. used for the synthesis of $Zn_2S_2$(ha), one may speculate that substitution of S by Se in the double-layer [$Zn_2S_2$] slabs to form $ZnS_{2-2y}Se_{2y}$(ha) at 120° C. may not be the optimum temperature. However, since 2D-[$Cd_2Se_2$(ha)] was indeed synthesized at the same temperature of 120° C. as that for preparing $Zn_2S_2$(ha), this temperature should be suitable for the substitution of Zn and S atoms by Cd and Se, respectively, to form quaternary $Zn_{2-2x}Cd_{2x}S_{2-2y}Se_{2y}$ compounds, as a result of synergetic effect on Cd and Se co-doping. Optical absorption spectra (FIG. 16) are suggestive of the formation of single phased $Zn_{2-2x}Cd_{2x}S_{2-2y}Se_{2y}$(ha), rather than a mixture of $Zn_2S_2$(ha), $Cd_2S_2$(ha), and $Cd_2Se_2$(ha).

TABLE 5

Optical absorption edges and PL emission peaks of the $Zn_{2-2x}Cd_{2x}S_{2-2y}Se_{2y}$ (ha) hybrid compounds ($\lambda_{ex}$ = 360 nm).

| | Nominal Cd mole fraction (x) | | | | | |
|---|---|---|---|---|---|---|
| | 0.2 | | | | 0.25 | |
| | Nominal Se mole fraction (y) | | | | | |
| | 0 | 0.05 | 0.1 | 0.15 | 0 | 0.15 |
| Estimated band gap (eV) | 3.0 | 2.85 | 2.8 | 2.75 | 2.95 | 2.75 |
| PL emission 1st peak (nm) | 410 | 436 | 439 | 445 | 420 | 450 |
| 2nd peak (nm) | 510 | 520 | 530 | 540 | 530 | 530 |

Figure 17:
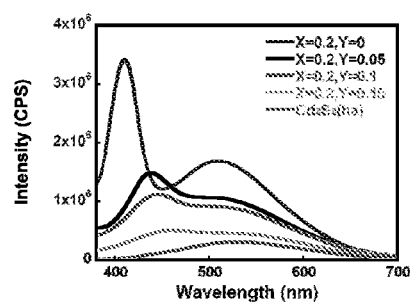
FIG. 17 illustrates room temperature PL emission spectra of the $Zn_{1.6}Cd_{0.4}S_{2-2y}Se_{2y}$(ha) (y=0, 0.05, 0.10, and 0.15) compounds, along with that of $Cd_2S_2$(ha) ($\lambda_{ex}$=360 nm).
Figure 28:
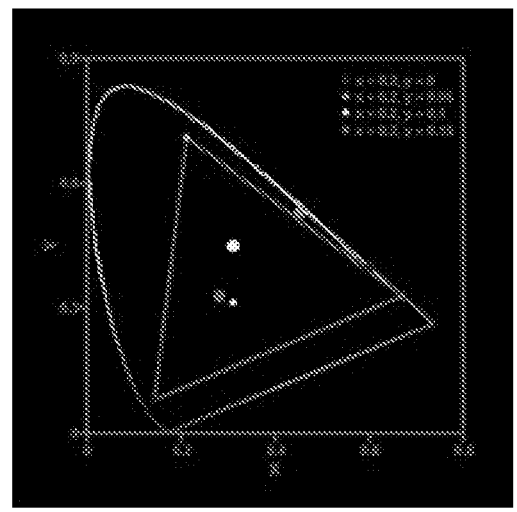
FIG. 28 illustrates CIE diagram showing the chromaticity coordinates for the quaternary $Zn_{2-2x}Cd_{2x}S_{2-2y}Se_{2y}$(ha) hybrid compounds with the nominal Cd mole fraction (x) fixed at 0.20 and the nominal Se mole fraction (y) of 0, 0.05, 0.10, and 0.15, respectively.

FIG. 17 shows the PL emission spectra of the quaternary $Zn_{1.6}Cd_{0.4}S_{2-2y}Se_{2y}$(ha) (x=0.20, y=0, 0.05, 0.10, and 0.15, respectively) compounds, together with that of the reference $Cd_2S_2$(ha). Similar to the ternary $Zn_{1.6}Cd_{0.4}S_2$(ha) (x=0.20) systems that show characteristic two emission peaks centered at 410 and 510 nm, respectively (FIG. 17, x=0.2, y=0), the quaternary $Zn_{1.6}Cd_{0.4}S_{2-2y}Se_{2y}$(ha) compounds also exhibit two PL emission peaks centered at 436 and 515 nm for y=0.05, 439 and 520 nm for y=0.10, and 445 and 525 nm for y=0.15, respectively (Table 5), although the relative intensity of the first peak drops significantly as the y value increases. In addition, a red shift is observed in the first peak as a function of increasing y, from 410 nm to 436, 439, and 445 nm for y=0 to 0.05, 0.10 and 0.15, respectively. Such a red shift is attributed to the lowering of the band gaps with higher y (see FIG. 16). Unlike the obvious red shift in their first emission bands, no significant shift is found in their second emission peaks, in accordance with the fact that their second emission bands are attributed to the substituted Cd atoms, rather than Se atoms. The y modulation also leads to a variation in the CIE coordinates of the quaternary $Zn_{2-2x}Cd_{2x}S_{2-2y}Se_{2y}$(ha) compounds (FIG. 28). For $Zn_{1.6}Cd_{0.4}S_{1.7}Se_{0.3}$(ha) (x=0.20, y=0.15) the CIE values are (0.28, 0.33), well within the white-light region and closer to the pure white CIE (0.31, 0.31) than the ternary phase $Zn_{1.6}Cd_{0.4}S_2$(ha). The PL emission intensities of the Cd and Se co-substituted $Zn_{2-2x}Cd_{2x}S_{2-2y}Se_{2y}$(ha) compounds decrease with the increase in y from 0 to 0.15 (FIG. 17), which can be also attributed to the lattice mismatch induced by doping Cd and Se atoms into the [$Zn_2S_2$] slabs.

Figure 18:
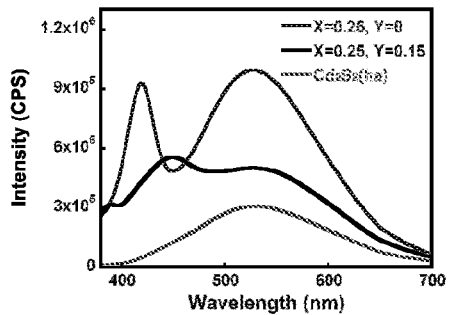
FIG. 18 illustrates room temperature PL emission spectra of the $Zn_{1.5}Cd_{0.5}S_{2-2y}Se_{2y}$(ha) compounds (y=0 and 0.15), along with that of $Cd_2S_2$(ha) ($\lambda_{ex}$=360 nm).
Figure 29:
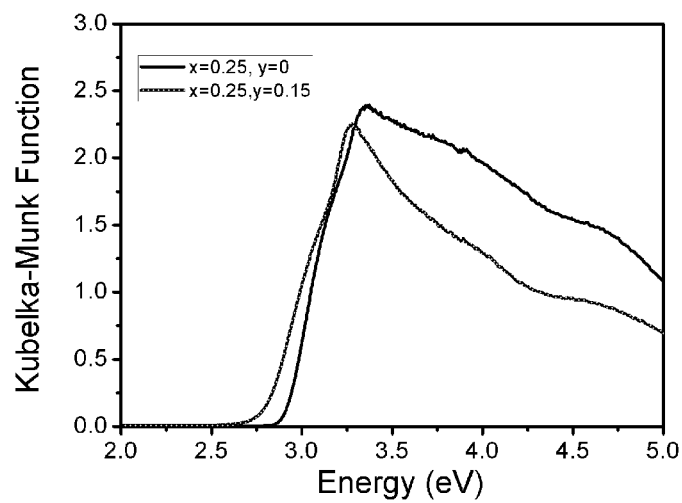
FIG. 29 illustrates optical absorption spectra of the Cd and Se co-substituted $Zn_{2-2x}Cd_{2x}S_{2-2y}Se_{2y}$(ha) hybrid compound with the nominal Cd mole fraction (x) fixed at 0.25 and the nominal Se mole fraction (y) of 0 and 0.15, respectively.
Figure 30:
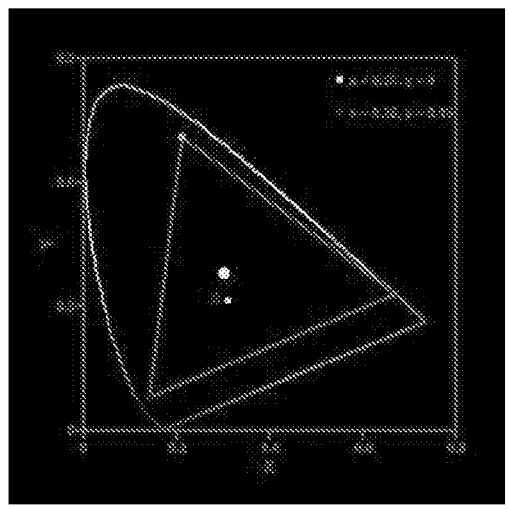
FIG. 30 illustrates CIE diagram showing the chromaticity coordinates for the quaternary $Zn_{2-2x}Cd_{2x}S_{2-2y}Se_{2y}$(ha) hybrid compounds with the nominal Cd mole fraction (x) fixed at 0.25 and the nominal Se mole fraction (y) of 0 and 0.15, respectively.

In addition, the quaternary $Zn_{1.5}Cd_{1.5}S_{1.7}Se_{0.3}$(ha) (x=0.25, y=0.15) hybrid compound was also synthesized at 120° C. (reaction time: 2 days). Compared with 2.95 eV of the absorption edge for the ternary $Zn_{1.5}Cd_{0.5}S_2$(ha) compound, the absorption edge for $Zn_{1.5}Cd_{0.5}S_{1.7}Se_{0.3}$(ha) is estimated to be 2.75 eV, indicating a small red shift of ca. 0.2 eV (FIG. 29). FIG. 18 displays the PL emission spectra of $Zn_{1.5}Cd_{0.5}S_2$(ha) and $Zn_{1.5}Cd_{0.5}S_{1.7}Se_{0.3}$(ha), together with that of $Cd_2S_2$(ha) for comparison. Similar to $Zn_{1.5}Cd_{0.5}S_2$(ha) that exhibits two emission peaks centered at 420 and 530 nm, $Zn_{1.5}Cd_{0.5}S_{1.7}Se_{0.3}$(ha) shows two emission bands centered at ca. 450 and 530 nm, respectively. Their second emission peaks are located at the same wavelength of 530 nm, since both have the same nominal Cd mole fractions of 0.25. Their first emission peaks shift from 420 nm for y=0.0 to 450 nm for y=0.15, corresponding to the red shift in the band gap (from 2.95 to 2.75 eV). Clearly, Se doping leads to a much more balanced white light emission spectrum for the quaternary phase $Zn_{1.5}Cd_{0.5}S_{1.7}Se_{0.3}$(ha). Consequently, the CIE coordinates move from (0.30, 0.38) for $Zn_{1.5}Cd_{0.5}S_2$(ha) to (0.28, 0.32) for $Zn_{1.5}Cd_{0.5}S_{1.7}Se_{0.3}$(ha), with the latter closer to the pure white color (0.31, 0.31) (FIG. 30). These results further demonstrate that the synergetic effect between doped Cd and Se atoms tunes the optical edges and PL emission spectra of the quaternary $Zn_{2-2x}Cd_{2x}S_{2-2y}Se_{2y}$(ha) compounds, giving rise to a more balanced white light.

Dependence of PL Emission on Layered Nanostructure

Figure 19:
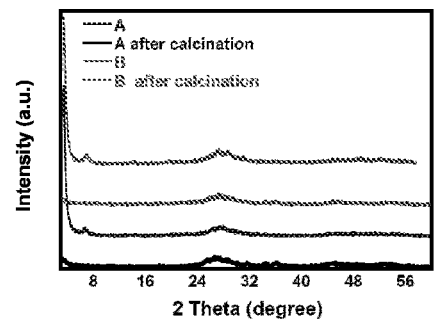
FIG. 19 illustrates PXRD patterns (a) and PL emission spectra (b) ($\lambda_{ex}$=360 nm) of A and B before and after the calcinations at 450° C. for 30 min, respectively. A: $Zn_{1.5}Cd_{0.5}S_2$(ha); B: $Zn_{1.6}Cd_{0.4}S_{1.7}Se_{0.3}$(ha).
Figure 19:
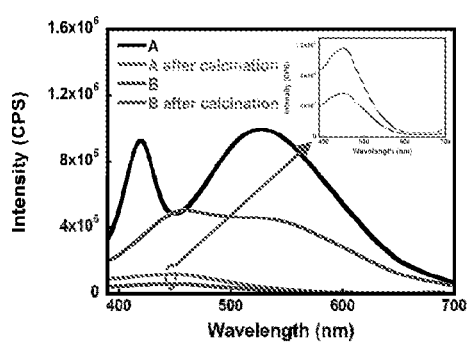

In order to elucidate the relationship between the layered nanostructure and the PL emission properties of the doubled-layered II-VI hybrid compounds, the ternary $Zn_{2-2x}Cd_{2x}S_2$(ha) (x=0.25) and quaternary $Zn_{2-2x}Cd_{2x}S_{2-2y}Se_{2y}$(ha) (x=0.20, y=0.15) hybrid compounds that emit white light were calcined at 450° C. for 30 min to remove the organic ligand n-hexylamine (ha), and thus their inorganic counterparts were obtained. FIG. 19 shows comparison on the PXRD patterns (a) and the PL emission spectra (b) of $Zn_{1.5}Cd_{0.5}S_2$(ha) and $Zn_{1.5}Cd_{0.5}S_{1.7}Se_{0.3}$(ha) before and after calcination, respectively. After calcination at 450° C. for 30 min, their first diffraction peaks located at around 3.5°(2θ) disappear (FIG. 19a), clearly indicating that their layered nanostructure is destroyed due to the evaporation of n-hexylamine during the calcination. Accordingly, the PL emission spectra of the inorganic counterparts are quite different from those of the as-made hybrid structures (FIG. 19b). Both show only one very broad emission band (~450 nm) and the intensity is reduced drastically. Note the similarity of these bands to those of the ZnS-based materials mentioned in Section 3.1, which originate from the presence of the sulfur vacancies in the ZnS-based materials. On the contrary, the two PL emission bands of the ternary $Zn_{2-2x}Cd_{2x}S_2$(ha) and quaternary $Zn_{2-2x}Cd_{2x}S_{2-2y}Se_{2y}$(ha) hybrid compounds originate from their unique double-layered nanostructure.

$Zn_{2-2x}Cd_{2x}S_2$(ha) Based White LED Assemblies

Figure 20:
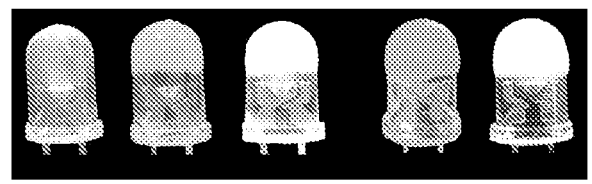
FIG. 20 illustrates white-light assemblies built on the 2D-[$Zn_{2-2x}Cd_{2x}S_2$(ha)] and 2D-[$Zn_{2-2x}Cd_{2x}S_{2-2y}Se_{2y}$(ha)] phosphors, (a) A 5 mm reference UV LED (360 nm) illuminates blue light (commercially available from Le Group Fox, Inc.); (b) the same LED coated with a thin layer of $Zn_{1.5}Cd_{0.5}S_2$(ha); (c) the same LED in (b) illuminating; (d) the same LED coated with a thin layer of $Zn_{1.6}Cd_{0.4}S_{1.7}Se_{0.3}$(ha); (e) the same LED in (d) illuminating.

FIG. 20 illustrates photos of the white LEDs fabricated using the ternary $Zn_{1.5}Cd_{0.5}S_2$(ha) and quaternary $Zn_{1.5}Cd_{0.5}S_{1.7}Se_{0.3}$(ha) samples. The reference UV LED (360 nm) emits blue light (FIG. 20a). Upon coating its surface with a thin layer of $Zn_{1.5}Cd_{0.5}S_2$(ha) (FIG. 20b), the LED change the emission color from blue to white (FIG. 20c). Coating a layer of $Zn_{1.5}Cd_{0.5}S_{1.7}Se_{0.3}$(ha) (FIG. 20d) gives white light emission shown in FIG. 20e.

In sum, Cd and/or Se-substituted $Zn_2S_2$(L)-based hybrid semiconductors have been synthesized and structurally characterized. The $Zn_{2-2x}Cd_{2x}S_{2-2y}Se_{2y}$(ha) hybrid compounds not only are single phased, but also have the same layered nanostructure as that of $Zn_2S_2$(ha). The ternary $Zn_{2-2x}Cd_{2x}S_2$(ha) and quaternary $Zn_{2-2x}Cd_{2x}S_{2-2y}Se_{2y}$(ha) hybrid compounds exhibit two PL emission peaks, with one of which attributed to the band gap emission, and the other, originated from the doped Cd atoms and the surface sites related to their layered nanostructure. The amount of Cd and Se and synergetic effect between the two elements play a key role in affecting the optical absorption edge and the location of the two emission bands along with their relative intensities, as well as the quantum efficiency and color quality of the emitted white light. The ZnS-based ternary and quaternary hybrid semiconductors exhibit significantly enhanced PLQY compared to the white-light emitting CdS-based hybrid compounds. Upon removal of organic amines, the emission intensity of the inorganic counterpart is greatly reduced and is shifted from white light to a broad blue-green region (~450 nm). It is the unique layered nanostructure and the QCE and the surface sites associated with these nanostructures that play a critical role in the emission properties of the hybrid semiconductors. The white-light emitting ternary $Zn_{2-2x}Cd_{2x}S_2$(ha) and quaternary $Zn_{2-2x}Cd_{2x}S_{2-2y}Se_{2y}$(ha) compounds are promising for use as a new type of phosphors in WLEDs.

Examples

1. Experimental Section a) Materials $ZnCl_2$ (98%+, Alfa aesar), $Zn(NO_3)_2 \cdot H_2O$ (98%), $CdCl_2$ (99%, Alfa Aesar), S (99+%, Strem), Se (99.5%), $MnCl_2$ (97%, Alfa aesar), n-butylamine or ba (99%, Alfa Aesar), n-hexylamine or ha (99%, Alfa Aesar), n-propylamine or pa (99%, Alfa Aesar), n-octylamine or oa (99%, Alfa Aesar), dimethyl sulfoxide or DMSO (99.99%, Alfa Aesar), trans-stilbene (99%, Acros), and hexane (99.99) were all used as received without further purification.

b) Synthesis

All compounds were synthesized using solvothermal reactions. The proper amounts of reactants were weighed, placed into 23 ml Teflon-lined stainless acid digestion bombs and dissolved in the corresponding amine. Amines were used both as a reactant and as a solvent. Light yellow powder of $Zn_{1.7}Cd_{0.3}S_2$(L) was obtained from reactions of $ZnCl_2$ (0.231 g, 1.7 mmol), $CdCl_2$ (0.68 g, 0.3 mmol), and S (0.032 g, 1 mmol), in proper amine (pa, ba, ha, and oa) (6 ml) at 120° C. for 5 days (yield ~70% based on S). To remove the organic amine and excess $ZnCl_2$ and $CdCl_2$ after the reaction, the products were filtered and washed with water and ethanol followed by drying with acetone. The resultant powder was dried in the vacuum oven at 50° C. for 10 minutes. To synthesize Mn doped samples, various molar concentrations of Mn were added to the reaction mixture and heated at 120° C. for 5 days (yield ~60% based on S).

In some examples, $Zn_2S_2$(ha) was synthesized by reacting 0.272 g of $ZnCl_2$ (2 mmol), 0.032 g of S (1 mmol) in 3 ml of ha at 120° C. for 2 days. Cd substituted $Zn_{2-2x}Cd_{2x}S_2$(ha), Se substituted $Zn_2S_{2-2y}Se_{2y}$(ha), and Cd and Se co-substituted $Zn_{2-2x}Cd_{2x}S_{2-2y}Se_{2y}$(ha) samples were synthesized by reactions at various mole fractions of $CdCl_2$ (x=0~0.25) and/or Se (y=0~0.25) under the same conditions as for $Zn_2S_2$(ha). For comparison purpose, selected samples were heated at 450° C. under $N_2$ flow for 30 min to generate the corresponding inorganic counterparts.

c) Characterization Methods

Powder X-ray Diffraction (PXRD)

Powder X-ray diffraction (PXRD) analysis of samples was carried out on a Rigaku D/M-2200T automated diffraction system (Ultima$^+$) using Cu Kα radiation (λ=1.5406 Å). The data were collected at room temperature in a 2θ range of 3-60° with a scan speed of 2°/min. The operating power was 40 kV/40 mA. Data used for the Rietveld refinement of the double-layer 2D-[$(Zn_2S_2)$(ba)] and 2D-[$(Zn_2S_2)$(ha)] structures were collected in a 2θ range of 3-50° at room temperature with a scan speed of 0.057 min. The refinement results are summarized in Table 6, but the (hkl) index data of these crystalline structures are herein omitted, which were included in the Supporting Information associated with an article published by the present inventors after filing the priority document U.S. provisional application. See Roushan, M., et al., Angew. Chem., 2012, 51, 436-439, which, along with its Supporting Information, is hereby incorporated by reference.

TABLE 6

GSAS Rietveld refinement results for 2D – [$Zn_2S_2$(L)] (L = pa, ba, ha and oa).

| | Empirical Formula | | | |
|---|---|---|---|---|
| | $C_3H_9NS_2Zn_2$ | $C_4H_{11}NS_2Zn_2$ | $C_6H_{15}NS_2Zn_2$ | $C_8H_{19}NS_2Zn_2$ |
| Fw | 254.00 | 268.03 | 296.08 | 324.13 |
| Space Group | Pbca (No. 61) | Pbca (No. 61) | Pbca (No. 61) | Pbca (No. 61) |
| a (Å) | 6.240 | 6.189 | 6.190 | 6.210 |
| b (Å) | 5.801 | 5.747 | 5.746 | 5.703 |
| c (Å) | 37.704 | 42.595 | 52.501 | 62.502 |
| V (Å$^3$) | 1356.0 | 1514.7 | 1840.7 | 2213.5 |
| Z | 8 | 8 | 8 | 8 |
| T | 293 | 293 | 293 | 293 |
| λ (Å) | 1.54 | 1.54 | 1.54 | 1.54 |
| 2θ Range (°) | 3-50 | 3-50 | 3-50 | 3-50 |

Although in the above-exemplified hybrid structures, only a very limited number of amines, in particular propylamine, butylamine, hexylamine, and octylamine, are used as organic ligands, it would be apparent to a person skilled in the art that other amine compounds, including but not limited to monoamine or diamine compounds, could also be used as ligands so long as the hybrid structures formed can maintain white light emitting properties, among others. In particular, any monoamine or diamine compounds that can luminesce and can coordinate to the chalcogenide compounds described herein to form orderly layered structures would be useful ligands in the present invention. For illustration purpose, some other non-limiting examples of such amines are listed in Table 7. Therefore, these and other structurally similar monoamines or diamines could be functional equivalents to those disclosed in the present application and are encompassed by the present invention and claims.

TABLE 7

Selected aromatic amines and their normalized PL intensity ($I_N$).

| Chemical Name | $I_N$ | $\lambda_{max}$ (nm) |
|---|---|---|
| Octylamine (oa) | 1 | 413 |
| 4-Picoline | 15 | 430 |
| 4-Phenylpyridine | 9 | 413 |
| 4,4'-Bipyridine | 20 | 466 |
| 1,2-Bis(4-pyridyl)ethane | 34 | 510 |
| m-Xylylenediamine | 29 | 411 |
| p-Xylylenediamine | 20 | 428 |
| Aminoethylpiperazine | 32 | 418 |

Note:
$\lambda_{max}$ is the wavelength (nm) at the maximum emission intensity. Octylamine is the amine that gives the highest quantum yield among double-layer hybrid structures.

Optical Absorption and Optical Diffuse Reflectance

Optical absorption spectra were measured at room temperature on a Schimadzu UV-3600 UV/VIS/NIR spectrometer. Optical diffuse reflectance spectra were measured at room temperature on a Perkin-Elmer Lambda 850 UV/VIS spectrometer. The reflectance data were used to estimate the band gap using Kubelka-Munk function, $\alpha/S=(1-R)^2/2R$, where $\alpha$ is absorption coefficient, S is scattering coefficient and R is reflectance.

Thermo Gravimetric (TG) Analyses

Thermogravimetric (TG) analyses of samples were performed using the TA Instrument Q50 thermal gravimetric analyzer with nitrogen flow and sample purge rate at 40 ml/min and 60 ml/min respectively. About 10 mg of sample was loaded onto a platinum sample pan and heated from room temperature to 600° C. at a rate of 10° C./min under nitrogen flow. A summary of TG analysis and data can be found in Table 1.

Photolumenescence (PL) Emission

The room temperature photolumenescence (PL) emission spectra were collected on a Horiba/Jobin-Yvon Fluorolog-3™ double grating-double grating fluorescence spectrophotometer. Excitation wavelength of 360 nm was used for all samples. Absolute fluorescence quantum yield measurements were carried out on both solution and solid samples using an F-3018 Integrating Sphere mounted on the Horiba/Jobin-Yvon Fluorolog-3™ fluorescence spectrophotometer. Comparative method was also used to calculate fluorescence QY of solution samples using trans-stilbene as a reference dye. Results are summarized in Table 3.

2. CIE Coordinate Calculation

The Horiba Jobin Yvon software package Quantum Yield and Colour Calculator were used for CIE coordination calculations. In CIE 1931 chromaticity diagram coordinates of x=0.31, y=0.31 correspond to the pure white light and in CIE-1976 diagram, u'=0.20, v'=0.46 are coordinates for a white light.

3. Photoluminescence Quantum Yield (PLQY) Measurements and Calculations

PL emission spectra were recorded at room temperature using a Horiba/Jobin-Yvon Fluorolog-3™ double grating-double grating fluorescence spectrophotometer at an excitation wavelength of 360 nm. The measurement conditions were identical in all cases and therefore relative intensities can be compared. In order to limit the intensities of PL emission spectra for all samples to be less than $2 \times 10^6$ CPS, the two slits were fixed at 0.8 nm. Furthermore, the PLQYs of the samples were measured by the relative (comparative) method and the absolute method, respectively, and the results obtained from the two methods were found to be in a good agreement.

a) Absolute Method

Absolute fluorescence quantum yields were measured on both solution and solid samples using F-3018 Integrating Sphere which was mounted on Horiba/Jobin-Yvon Fluorolog-3™ fluorescence spectrophotometer. About 25 mg of powder was dispersed in 5 ml DMSO and placed in the sphere. Data were then collected over all emission angles and integrated. PL quantum yield was calculated using the following equation: $\Phi_f=(E_c-E_a)/(L_a-L_c)$ Where $E_c$ and $E_a$ are the integrated luminescence of the sample and empty sphere (or blank) respectively, $L_c$ and $L_a$ are the integrated excitation profiles of the sample and empty sphere (blank) when they are directly excited by the incident beam.

The same procedure was applied on solid samples. In this case, powders were placed on the glass slide and a blank glass slide was used as a reference. The results were in the similar ranges as those from the DMSO dispersed samples.

b) Relative (Comparative) Method

For all the measurements the 10 mm fluorescence cuvette was used and the absorbance was kept below 0.1 at the excitation wavelength in order to avoid the re-absorption effects. A constant slit width of 2 nm was used for both UV-vis absorbance and fluorescence measurements of all solution samples.

trans-Stilbene was used as a standard. UV-Vis absorbance spectrum of hexane was recorded as solvent background. Fluorescence spectra of the same solution were also recorded using the excitation wavelength of 320 nm. The stock solution of trans-stilbene in hexane was made by dissolving 1 mg of trans-stilbene in 20 ml of hexane. Then 50 μL from the stock solution was added to hexane using micropipette and the absorption and fluorescence of the solution was measured. This procedure was repeated 5 or 6 times and absorption and PL of the six solutions with increasing trans-stilbene concentration were measured. The integrated fluorescence intensity vs absorbance at the excitation wavelength was plotted. The same procedure was applied to another standard, quinine sulfate in 0.1 molar $H_2SO_4$ and the two standard compounds were cross-calibrated using the following equation:

$$\Phi_X = \Phi_{ST}\left(\frac{Grad_X}{Grad_{ST}}\right)\left(\frac{\eta_X^2}{\eta_{ST}^2}\right)$$

Where η is refractive index of the solvent for the standard sample and the test sample, $Grad_{ST}$ and $Grad_X$ are the slope of the intensity-absorbance curves for the standard and the sample, and $\Phi_{ST}$ and $\Phi_X$ are the quantum yield of the standard and sample, respectively (0.11 for trans-stilbene in hexane and 0.54 for quinine sulfate in 0.1 molar $H_2SO_4$). This was done to ensure that the quantum yields of both standards are in agreement with the reported literature values. A deviation of ±10% is acceptable.

After the cross-calibration of the standard samples, the quantum yield for the hybrid sample was calculated using the same equation. Typically, a 25 mg of sample was added to 20 ml of DMSO and dispersed in the solvent by sonication for 3 minutes. Absorption and fluorescence of samples with 5-6 different concentrations were measured and the graphs of integrated fluorescence intensity vs absorbance at the excitation wavelength of 360 nm for the samples and 325 nm for the standard were plotted. Fluorescence quantum yield (QY) was calculated by inserting the values obtained from the slopes of the graphs in the above equation.

4. White LED Assemblies

For white LED device fabrication, the following procedure was used. After the reaction, the remaining solvent (amine) was removed from the reaction vessel. The product was then mixed with water and ethanol (at 1:1 ratio) and centrifuged (1500 rpm for 5 minutes). This process was repeated 3-5 times until a neutral pH was achieved (using pH paper). Finally, dimethyl sulfoxide (DMSO) was added and mixed with the solid and centrifuged using the same conditions as above. The resultant gel (~20 mg) was added to 10 ml of DMSO and treated by an ultrasonic processor. The dilute gel-like sample was used to set up a WLED assembly. An alternative way to obtain a gel-like sample was by dispersing the powder in DMSO. For the WLED signs shown in FIG. 3d, solution was coated onto a glass slide and the coated glass slide was placed on top of the UV lamp and excited by a light source with wavelength of 365 nm. For the WLEDs shown in FIG. 3c, solution was coated onto the surface of a commercial 360 nm UV-LED.

To illustrate, the two white light emitting hybrid semiconductors, $Zn_{2-2x}Cd_{2x}S_2(ha)$ (x=0.25) and $Zn_{2-2x}Cd_{2x}S_{2-2y}Se_{2y}(ha)$ (x=0.20, y=0.15) were chosen for use as phosphors in WLED devices. First, 50 mg of the samples were dispersed into 10 ml of DMSO and treated by an ultrasonic processor (Model VCX-750, Sonics & Materials, Inc.) at 30 W for 30 s at room temperature, respectively; Secondly, the resultant suspensions were centrifuged to remove some DMSO followed by carefully grinding to obtain a "gel-like" pastes; Finally, a commercial 360 nm UV-LED (commercially available from Le Group Fox, Inc.) was dipped into the pastes, respectively, followed by rolling to make the pastes coated onto its surface uniformly.

It will be understood by those of skill in the art that numerous and various modifications can be made without departing from the spirit of the present invention. Therefore, it should be clearly understood that the various embodiments of the present invention described herein are illustrative only and not intended to limit the scope of the present invention.

All publications cited in the specification, both patent publications and non-patent publications, are herein fully incorporated by reference in their entireties for all purpose.

What is claimed is:

1. An inorganic-organic hybrid semiconductor material capable of emitting white light, the material comprising a crystalline structure formed from a repeating unit, the repeating unit comprising a two-dimensional semiconducting inorganic double layer of a II-VI chalcogenide compound, wherein two opposite sides of the double layer are each attached to a layer of an organic ligand, wherein the II-VI chalcogenide compound is characterized by formula $[M_{2(1-x)}N_{2x}Y_{2(1-y)}Z_{2y}]$, said material optionally doped with Manganese (Mn) in the range of about 0.01 to 0.5 mol %, wherein:
   M is Zn;
   N is Cd;
   Y and Z are each independently selected from the group consisting of S, Se and Te;
   x is a fractional number between 0.05 and 0.3, inclusive; and
   y is 0, 1, or a fractional number between 0 and 1.

2. The inorganic-organic hybrid semiconductor material of claim 1, characterized by formula $[M_{2(1-x)}N_xY_{2(1-y)}Z_{2y}(L)]$, wherein:
   M is Zn;
   N is Cd;
   Y and Z are each independently selected from the group consisting of S, Se and Te; and
   L is an organic ligand.

3. The inorganic-organic hybrid semiconductor material of claim 2, wherein y is 0, further characterized by formula $[M_{2(1-x)}N_{2x}Y_2(L)]$, wherein:
   M is Zn;
   N is Cd;
   Y is selected from the group consisting of S, Se and Te;
   x is a fractional number between 0.05 and 0.3, inclusive; and
   y is a fractional number between 0 and 0.15.

4. The inorganic-organic hybrid semiconductor material of claim 2, further characterized by formula $[Zn_{2(1-x)}Cd_xS_{2(1-y)}Se_{2y}(L)]$.

5. The inorganic-organic hybrid semiconductor material according to claim 2, wherein L is an organic ligand capable of coordinating to Zn and/or Cd to form an orderly layered structure.

6. The inorganic-organic hybrid semiconductor material according to claim 1, doped with a Mn in the range of about 0.01 to 0.2 mol %.

7. The inorganic-organic hybrid semiconductor material of claim 6, wherein said small amount is in the range of about 0.08 mol %.

8. The inorganic-organic hybrid semiconductor material according to claim 1, wherein said white light emitted has CIE-1931 coordinates x and y both in the range of about 0.28 to 0.35 or has CIE-1976 coordinate u' is in the range of about 0.15-0.25 and coordinate v' in the range of about 0.40-0.50.

9. The inorganic-organic hybrid semiconductor material according to claim 1, wherein the photoluminescence quantum yield (PLQY) of the semiconductor material is at least about 15%.

10. The inorganic-organic hybrid semiconductor material according to claim 1, wherein the photoluminescence quantum yield (PLQY) of the semiconductor material is in the range of about 15 to about 40%.

11. The inorganic-organic hybrid semiconductor material of claim 1, characterized by a formula selected from the group consisting of $Zn_{1.9}Cd_{0.1}S_2(L)$, $Zn_{1.8}Cd_{0.2}S_2(L)$, $Zn_{1.7}Cd_{0.3}S_2(L)$, $Zn_{1.6}Cd_{0.4}S_2(L)$, $Zn_{1.5}Cd_{0.5}S_2(L)$, $Zn_{1.9}Cd_{0.1}S_{1.9}Se_{0.1}(L)$, $Zn_{1.8}Cd_{0.2}S_{1.9}Se_{0.1}(L)$, $Zn_{1.7}Cd_{0.3}S_{1.9}Se_{0.1}(L)$, $Zn_{1.6}Cd_{0.4}S_{1.9}Se_{0.1}(L)$, $Zn_{1.5}Cd_{0.5}S_{1.9}Se_{0.1}(L)$, $Zn_{1.9}Cd_{0.1}S_{1.8}Se_{0.2}(L)$, $Zn_{1.7}Cd_{0.3}S_{1.8}Se_{0.2}(L)$, $Zn_{1.6}Cd_{0.4}S_{1.8}Se_{0.2}(L)$, $Zn_{1.5}Cd_{0.5}S_{1.8}Se_{0.2}(L)$, $Zn_{1.9}Cd_{0.1}S_{1.7}Se_{0.3}(L)$, $Zn_{1.7}Cd_{0.3}S_{1.7}Se_{0.3}(L)$, $Zn_{1.6}Cd_{0.4}S_{1.7}Se_{0.3}(L)$, and $Zn_{1.5}Cd_{0.5}S_{1.7}Se_{0.3}(L)$, wherein L at each occurrence is independently selected from propylamine, butylamine, hexylamine, and octylamine.

12. The inorganic-organic hybrid semiconductor material of claim 11, further doped by Mn in an amount in the range of about 0.01 mol % to about 0.2 mol % based on each respective formula.

13. A composition comprising an inorganic-organic hybrid semiconductor material according to claim 1.

14. A method for preparing an inorganic-organic hybrid semiconductor material characterized by formula $[M_{2(1-x)}N_xY_{2(1-y)}Z_{2y}(L)]$, the method comprising a one-pot solvothermal reaction, wherein:

M is Zn;

N is Cd;

Y and Z are each independently selected from the group consisting of S, Se and Te;

x is a fractional number between 0.05 and 0.3, inclusive; and y is 0, 1, or a fractional number between 0 and 1; and L is an organic ligand.

15. The method of claim 14, wherein said one-pot solvothermal reaction comprises reacting a zinc salt, a cadmium salt, and sulfur in a proper amount ratio in a solvent.

16. A semiconductor device comprising the inorganic-organic hybrid semiconductor material according to claim 1.

17. A light-emitting device comprising the inorganic-organic hybrid semiconductor material according to claim 1.

18. A method of making a light-emitting device capable of emitting white light, the method comprising coating an inorganic-organic hybrid semiconductor material according to claim 1, or a composition thereof, on the device.

19. The inorganic-organic hybrid semiconductor material according to claim 2, wherein L is an organic ligand capable of coordinating to Zn and/or Cd to form an orderly layered structure.

20. The inorganic-organic hybrid semiconductor material according to claim 19, wherein said organic ligand is an organic amine selected from ethylamine, propylamine, butylamine, pentylamine, hexylamine, heptylamine, octylamine, 4-picoline, 4-phenylpyridine, 4,4'-bipyridine, 1,2-bis(4-pyridyl)ethane, m-xylylenediamine, p-xylylenediamine, and aminoethylpiperazine.

* * * * *